(12) United States Patent
Terada et al.

(10) Patent No.: US 12,495,532 B2
(45) Date of Patent: Dec. 9, 2025

(54) ELECTROMAGNETIC WAVE SHIELD FILM

(71) Applicant: TATSUTA ELECTRIC WIRE & CABLE CO., LTD., Osaka (JP)

(72) Inventors: Tsunehiko Terada, Kyoto (JP); Kousuke Kado, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 5 days.

(21) Appl. No.: 18/689,251

(22) PCT Filed: Jul. 22, 2022

(86) PCT No.: PCT/JP2022/028473
§ 371 (c)(1),
(2) Date: Mar. 5, 2024

(87) PCT Pub. No.: WO2023/037770
PCT Pub. Date: Mar. 16, 2023

(65) Prior Publication Data
US 2025/0133711 A1      Apr. 24, 2025

(30) Foreign Application Priority Data
Sep. 7, 2021 (JP) ................. 2021-145521

(51) Int. Cl.
*H05K 9/00* (2006.01)
*B32B 7/12* (2006.01)

(52) U.S. Cl.
CPC ............ *H05K 9/0086* (2013.01); *B32B 7/12* (2013.01); *H05K 9/0084* (2013.01); *B32B 2307/212* (2013.01)

(58) Field of Classification Search
CPC .................................................. H05K 9/0086
See application file for complete search history.

(56) References Cited

U.S. PATENT DOCUMENTS

| | | |
|---|---|---|
| 2013/0285846 A1 | 10/2013 | Kagawa |
| 2021/0216843 A1 | 7/2021 | Mochizuki et al. |

FOREIGN PATENT DOCUMENTS

| | | | | |
|---|---|---|---|---|
| JP | 2021082896 A | 5/2021 | | |
| WO | 2012090586 A1 | 7/2012 | | |
| WO | WO-2018147298 A1 * | 8/2018 | ............. | B32B 15/08 |
| WO | 2019239976 A1 | 12/2019 | | |

OTHER PUBLICATIONS

International Search Report (ISR) dated Oct. 18, 2022 filed in PCT/JP2022/028473.

* cited by examiner

*Primary Examiner* — Hung V Ngo
(74) *Attorney, Agent, or Firm* — RANKIN, HILL & CLARK LLP

(57) ABSTRACT

Provided is an electromagnetic wave shielding film capable of blocking or allowing passage of only an electromagnetic wave with a specific frequency. An electromagnetic wave shielding film, including: a metamaterial layer including a first main surface and a second main surface opposite to the first main surface; and an adhesive layer formed on the second main surface of the metamaterial layer, wherein when the metamaterial layer is viewed in a plan view from at least one of the first main surface or the second main surface, the metamaterial layer includes a conductive region where predetermined patterns made of a conductive material are periodically arranged, and a non-conductive region other than the conductive region.

20 Claims, 24 Drawing Sheets

ELECTROMAGNETIC WAVE SHIELD FILM

TECHNICAL FIELD

The present invention relates to an electromagnetic wave shielding film.

BACKGROUND ART

A mobile device such as a smartphone or a tablet terminal includes a shielded flexible printed wiring board to which an electromagnetic shielding film is attached in order to block electromagnetic waves internally generated and electromagnetic waves entering from the outside. A shielding layer for use in the electromagnetic wave shielding film is a thin metal layer formed by vapor deposition, sputtering, plating, or the like, or is formed from, for example, a conductive paste having a high conductive filler content. Full-scale spread of technologies such as 5G in the future will lead to higher frequencies and faster transmission speeds for communication of larger amounts of data, which will result in further demand for noise countermeasures for electronic devices.

Patent Literature 1 discloses a near-field electromagnetic wave absorber having a high ability to absorb electromagnetic noises of several hundred MHz to several GHz and also having an electromagnetic wave absorption ability in which anisotropy is suppressed. The near-field electromagnetic wave absorber is obtained by bonding multiple electromagnetic wave absorbing films each obtained by forming a metal thin film on one surface of a plastic film. The metal thin film of at least one of the electromagnetic wave absorbing films has a thin film layer of a magnetic metal. On the metal thin film of at least one of the electromagnetic wave absorbing films, a large number of substantially parallel, intermittent, and linear scratches with irregular width are formed at irregular intervals in multiple directions.

CITATION LIST

Patent Literature

Patent Literature 1: WO 2012/090586

SUMMARY OF INVENTION

Technical Problem

Due to the spread of wireless transfer technology and the like, recent years have seen an increasing demand for blocking or allowing passage of only an electromagnetic wave with a specific frequency.

While the near-field electromagnetic wave absorber disclosed in Patent Literature 1 is capable of absorbing electromagnetic waves in a broad frequency band, it is not capable of blocking or allowing passage of only an electromagnetic wave with a specific frequency.

The present invention was made to solve the above problem. The present invention aims to provide an electromagnetic wave shielding film capable of blocking or allowing passage of only an electromagnetic wave with a specific frequency.

Solution to Problem

The electromagnetic wave shielding film of the present invention includes a metamaterial layer including a first main surface and a second main surface opposite to the first main surface; and an adhesive layer formed on the second main surface of the metamaterial layer, wherein when the metamaterial layer is viewed in a plan view from at least one of the first main surface or the second main surface, the metamaterial layer includes a conductive region where predetermined patterns made of a conductive material are periodically arranged, and a non-conductive region other than the conductive region.

In the electromagnetic wave shielding film of the present invention, the metamaterial layer includes a conductive region where predetermined patterns made of a conductive material are periodically arranged, and a non-conductive region other than the conductive region.

Such a conductive region where predetermined patterns made of a conductive material are periodically arranged allows resonance with an electromagnetic field with a specific frequency and can block an electromagnetic wave with a specific frequency.

The frequency of an electromagnetic wave to be blocked can be controlled by adjusting the material, shape, size, arrangement, and period of the predetermined patterns, the dielectric constant of the material of the non-conductive region, and the like.

In the electromagnetic wave shielding film of the present invention, the predetermined patterns may include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

Use of such a pattern can block an electromagnetic wave with a desired frequency.

In the electromagnetic wave shielding film of the present invention, preferably, the non-conductive region includes a non-conductive sheet made of a resin composition, and the predetermined patterns are embedded in the non-conductive sheet.

The metamaterial layer can be easily formed by embedding the predetermined patterns in the non-conductive sheet made of a resin composition.

In the electromagnetic wave shielding film of the present invention, preferably, the resin composition has a relative permittivity of 1 to 20000.

An electromagnetic wave with a desired frequency can be blocked by adjusting the relative permittivity of the resin composition.

In the electromagnetic wave shielding film of the present invention, preferably, the resin composition contains a filler, and preferably, the filler is an organic filler and/or an inorganic filler.

The presence of a functional filler in the resin composition can improve dissipative properties and shielding properties of the metamaterial layer. The filler also functions as a filling agent.

In the electromagnetic wave shielding film of the present invention, preferably, the adhesive layer is a conductive adhesive layer.

The electromagnetic wave shielding film of the present invention is intended to be placed on a printed wiring board.

Here, when the adhesive layer is a conductive adhesive layer, connecting the adhesive layer to a ground circuit of the printed wiring board can establish an electrical connection between the conductive region of the metamaterial layer and the ground circuit. This, as a result, can improve the shielding properties of the electromagnetic wave shielding film.

In the electromagnetic wave shielding film of the present invention, a conductive layer and/or a magnetic layer may be formed between the adhesive layer and the metamaterial layer. A conductive layer and/or a magnetic layer may be formed on the first main surface of the metamaterial layer.

When the electromagnetic wave shielding film includes a conductive layer or a magnetic layer, the conductive layer or the magnetic layer functions as a shielding layer, improving the shielding properties of the electromagnetic wave shielding film as a whole.

Preferably, in the electromagnetic wave shielding film of the present invention, a protective layer is formed on the first main surface of the metamaterial layer.

The protective layer, when formed, can prevent the metamaterial layer and the adhesive layer from being damaged by external impact or the like.

The protective layer also improves handling because the electromagnetic wave shielding film can be carried, for example, without touching either the metamaterial layer or the adhesive layer.

Another electromagnetic wave shielding film of the present invention includes a metamaterial layer including a first main surface and a second main surface opposite to the first main surface; and an adhesive layer formed on the second main surface of the metamaterial layer, wherein when the metamaterial layer is viewed in a plan view from at least one of the first main surface or the second main surface, the metamaterial layer includes a non-conductive region where predetermined patterns made of a non-conductive material are periodically arranged, and a conductive region other than the non-conductive region.

In the electromagnetic wave shielding film of the present invention, the metamaterial layer includes a non-conductive region where predetermined patterns made of a non-conductive material are periodically arranged, and a conductive region other than the non-conductive region.

In the electromagnetic wave shielding film of the present invention, the conductive region functions as a shielding layer.

A periodical arrangement of the predetermined patterns made of a non-conductive material allows resonance with an electromagnetic field with a specific frequency and allows passage of an electromagnetic wave with a specific frequency.

The frequency of an electromagnetic wave to pass through can be controlled by adjusting the material, shape, size, arrangement, and period of the predetermined patterns, the dielectric constant of the non-conductive material, and the like.

In the electromagnetic wave shielding film of the present invention, the predetermined patterns may include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

Use of such a pattern allows passage of an electromagnetic wave with a desired frequency.

In the electromagnetic wave shielding film of the present invention, preferably, the conductive region includes a conductive sheet made of a conductive material, and the predetermined patterns are embedded in the conductive sheet.

The metamaterial layer can be easily formed by embedding the predetermined patterns in the conductive sheet.

In the electromagnetic wave shielding film of the present invention, preferably, the non-conductive material has a relative permittivity of 1 to 20000.

An electromagnetic wave with a desired frequency can be blocked by adjusting the relative permittivity of the non-conductive material.

In the electromagnetic wave shielding film of the present invention, preferably, the non-conductive material includes a filler, and preferably, the filler is an organic filler and/or an inorganic filler.

The presence of a functional filler in the non-conductive material can improve the dissipative properties and shielding properties of the metamaterial layer.

In the electromagnetic wave shielding film of the present invention, preferably, the predetermined patterns are outlined with through holes penetrating from the first main surface to the second main surface of the metamaterial layer, and the non-conductive material is air.

In the electromagnetic wave shielding film according to such an aspect, electromagnetic waves are not easily reflected or absorbed in the through holes. This makes it easy for an electromagnetic wave with a specific frequency to suitably pass through the electromagnetic wave shielding film.

In the electromagnetic wave shielding film of the present invention, preferably, the adhesive layer is a conductive adhesive layer.

The electromagnetic wave shielding film of the present invention is intended to be placed on a printed wiring board.

Here, when the adhesive layer is a conductive adhesive layer, connecting the adhesive layer to a ground circuit of the printed wiring board can establish an electrical connection between the conductive region of the metamaterial layer and the ground circuit. This, as a result, can improve the shielding properties of the electromagnetic wave shielding film.

In the electromagnetic wave shielding film of the present invention, a conductive layer and/or a magnetic layer may be formed between the adhesive layer and the metamaterial layer. A conductive layer and/or a magnetic layer may be formed on the first main surface of the metamaterial layer.

When the electromagnetic wave shielding film includes a conductive layer or a magnetic layer, the conductive layer or the magnetic layer functions as a shielding layer, improving the shielding properties of the electromagnetic wave shielding film as a whole.

Preferably, in the electromagnetic wave shielding film of the present invention, a protective layer is formed on the first main surface of the metamaterial layer.

The protective layer, when formed, can prevent the metamaterial layer and the adhesive layer from being damaged by external impact or the like.

The protective layer also improves handling because the electromagnetic wave shielding film can be carried, for example, without touching either the metamaterial layer or the adhesive layer.

Advantageous Effects of Invention

The present invention can provide an electromagnetic wave shielding film capable of blocking or allowing passage of only an electromagnetic wave with a specific frequency.

DESCRIPTION OF EMBODIMENTS

Hereinafter, the electromagnetic wave shielding film of the present invention is specifically described, but the present invention is not limited to the following embodiments and can be suitably modified without departing from the gist of the present invention.

First Embodiment

First, an electromagnetic wave shielding film according to a first embodiment of the present invention is described.

Figure 1A:
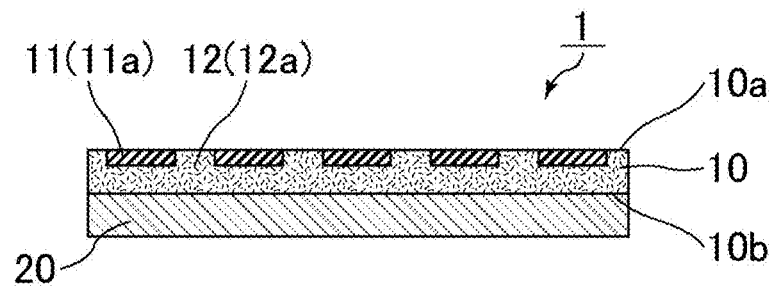
FIG. 1A is a schematic cross-sectional view of an example of an electromagnetic wave shielding film according to a first embodiment of the present invention.

An electromagnetic wave shielding film 1 shown in FIG. 1A includes a metamaterial layer 10 including a first main surface 10a and a second main surface 10b opposite to the first main surface 10a, and an adhesive layer 20 formed on the second main surface 10b of the metamaterial layer 10.

Figure 1B:
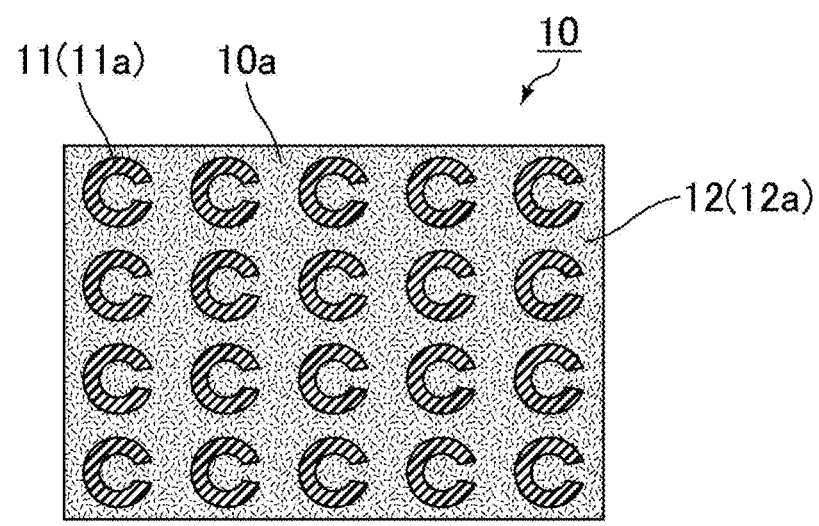
FIG. 1B is a schematic plan view of an example of a metamaterial layer of the electromagnetic wave shielding film according to the first embodiment of the present invention, viewed from a first main surface of the metamaterial layer.
Figure 2A:
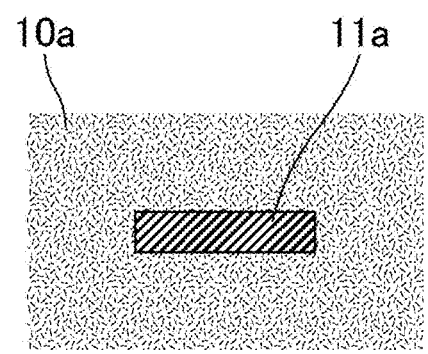
FIG. 2A is a schematic plan view of an example shape of a predetermined pattern made of a conductive material in the electromagnetic wave shielding film according to the first embodiment of the present invention.
Figure 2B:
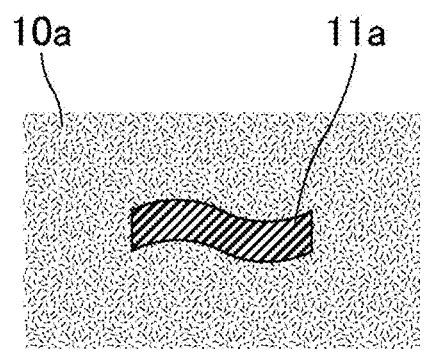
FIG. 2B is a schematic plan view of an example shape of a predetermined pattern made of a conductive material in the electromagnetic wave shielding film according to the first embodiment of the present invention.
Figure 2C:
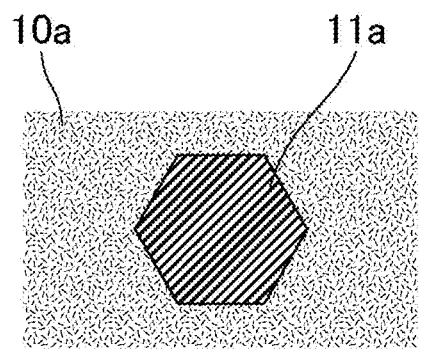
FIG. 2C is a schematic plan view of an example shape of a predetermined pattern made of a conductive material in the electromagnetic wave shielding film according to the first embodiment of the present invention.
Figure 2D:
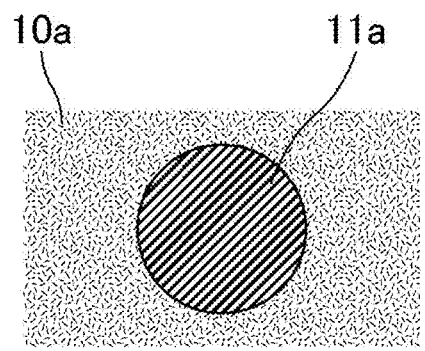
FIG. 2D is a schematic plan view of an example shape of a predetermined pattern made of a conductive material in the electromagnetic wave shielding film according to the first embodiment of the present invention.
Figure 2E:
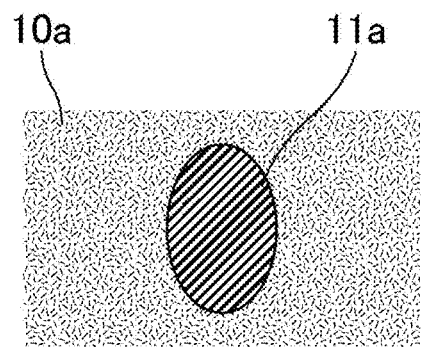
FIG. 2E is a schematic plan view of an example shape of a predetermined pattern made of a conductive material in the electromagnetic wave shielding film according to the first embodiment of the present invention.
Figure 2F:
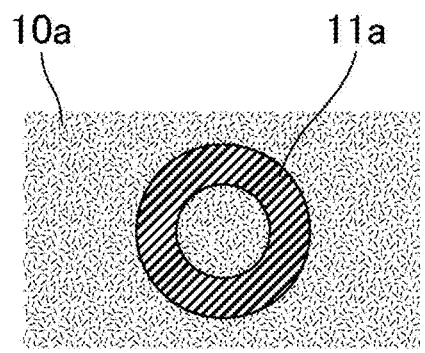
FIG. 2F is a schematic plan view of an example shape of a predetermined pattern made of a conductive material in the electromagnetic wave shielding film according to the first embodiment of the present invention.
Figure 2G:
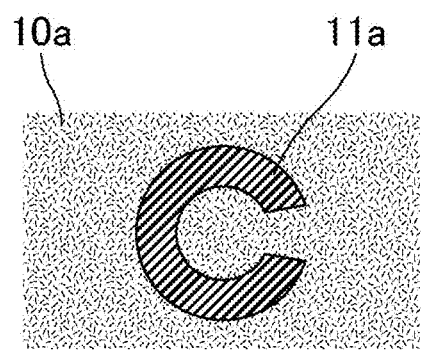
FIG. 2G is a schematic plan view of an example shape of a predetermined pattern made of a conductive material in the electromagnetic wave shielding film according to the first embodiment of the present invention.
Figure 2H:
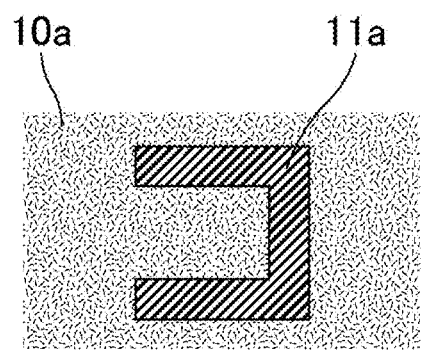
FIG. 2H is a schematic plan view of an example shape of a predetermined pattern made of a conductive material in the electromagnetic wave shielding film according to the first embodiment of the present invention.
Figure 2I:
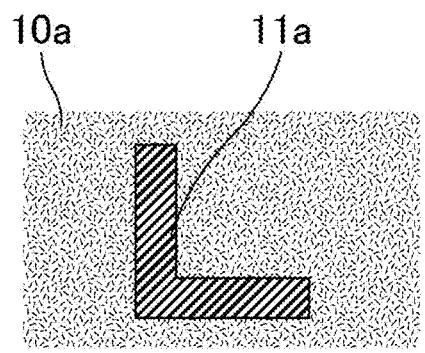
FIG. 2I is a schematic plan view of an example shape of a predetermined pattern made of a conductive material in the electromagnetic wave shielding film according to the first embodiment of the present invention.
Figure 2J:
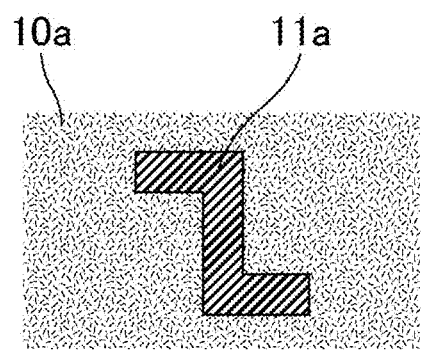
FIG. 2J is a schematic plan view of an example shape of a predetermined pattern made of a conductive material in the electromagnetic wave shielding film according to the first embodiment of the present invention.
Figure 2K:
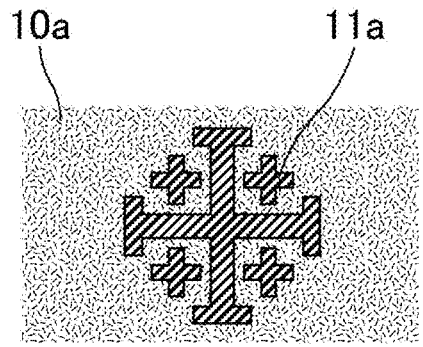
FIG. 2K is a schematic plan view of an example shape of a predetermined pattern made of a conductive material in the electromagnetic wave shielding film according to the first embodiment of the present invention.

As shown in FIG. 1A and FIG. 1B, the metamaterial layer 10 includes a conductive region 11 and a non-conductive region 12 other than the conductive region 11.

The conductive region 11 is where predetermined patterns 11a made of a conductive material are periodically arranged.

As shown in FIG. 1B, in the electromagnetic wave shielding film 1, the predetermined patterns 11a are C-shaped and arranged such that they are positioned at the vertices of square cells.

In the electromagnetic wave shielding film 1, the metamaterial layer 10 includes the conductive region 11 where the predetermined patterns 11a made of a conductive material are periodically arranged, and the non-conductive region 12 other than the conductive region.

The conductive region 11 where the predetermined patterns 11a made of such a conductive material are periodically arranged allows resonance with an electromagnetic field with a specific frequency and can block an electromagnetic wave with a specific frequency.

As shown in FIG. 1A, in the electromagnetic wave shielding film 1, the non-conductive region 12 includes a non-conductive sheet 12a made of a resin composition, and the predetermined patterns 11a are embedded in the non-conductive sheet 12a.

In the electromagnetic wave shielding film 1, the predetermined patterns 11a are formed only adjacent to the first main surface 10a of the metamaterial layer 10 but not adjacent to the second main surface 10b.

The metamaterial layer 10 according to such an aspect can be easily formed by embedding the predetermined patterns 11a in the non-conductive sheet 12a.

The predetermined patterns 11a can be formed by forming patterns on the surface of the non-conductive sheet 12a by a usual method such as printing, plating, or vapor deposition, and pressing the patterns into the non-conductive sheet 12a.

In the electromagnetic wave shielding film of the present invention, the predetermined patterns 11a may be placed on the surface of the non-conductive sheet 12a, instead of being embedded.

In the electromagnetic wave shielding film 1, the frequency of an electromagnetic wave to be blocked can be controlled by adjusting the material, shape, size, arrangement, and period of the predetermined patterns 11a, the dielectric constant of the material of the non-conductive region 12, and the like.

Hereinafter, a preferred aspect of each element of the electromagnetic wave shielding film 1 is described.

In the electromagnetic wave shielding film 1, the predetermined patterns 11a may be made of any conductive material, but a material such as copper, silver, aluminum, or carbon is preferred. The conductive material may be a conductive paste containing any of these materials.

In the electromagnetic wave shielding film 1, the predetermined patterns 11a are C-shaped. Yet, in the electromagnetic wave shielding film of the present invention, as shown in FIGS. 2A to 2K, preferably, the predetermined patterns 11a include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

Use of such a pattern can block an electromagnetic wave with a desired frequency.

In the electromagnetic wave shielding film 1 shown in FIG. 1B, the predetermined C-shaped patterns 11a each having the same shape are positioned at the vertices of square cells.

Yet, in the electromagnetic wave shielding film of the present invention, the predetermined patterns may be arranged in any manner as long as they are periodically arranged.

For example, each predetermined pattern 11a may include one figure alone or two or more figures in combination.

A more specific arrangement of the predetermined patterns is described with reference to the drawings.

Figure 3A:
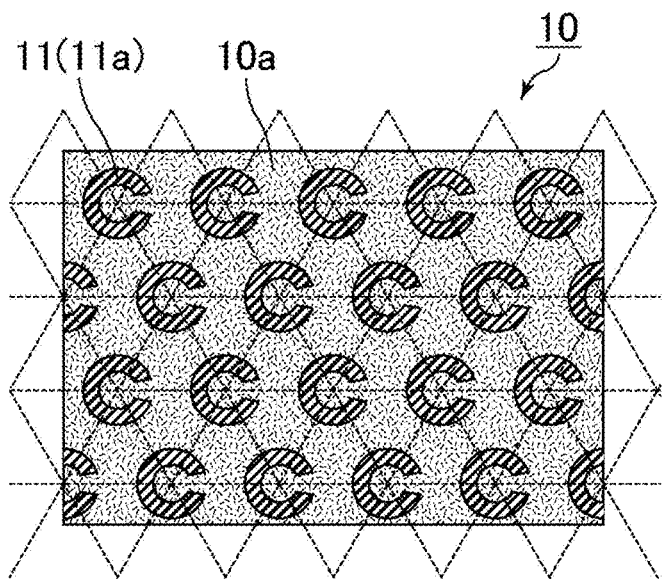
FIG. 3A is a schematic plan view of an example of predetermined patterns in the electromagnetic wave shielding film according to the first embodiment of the present invention.

In the electromagnetic wave shielding film of the present invention, as shown in FIG. 3A, the predetermined C-shaped patterns 11a may be periodically arranged such that they are positioned at the vertices of equilateral triangles laid out on the plane.

Figure 3B:
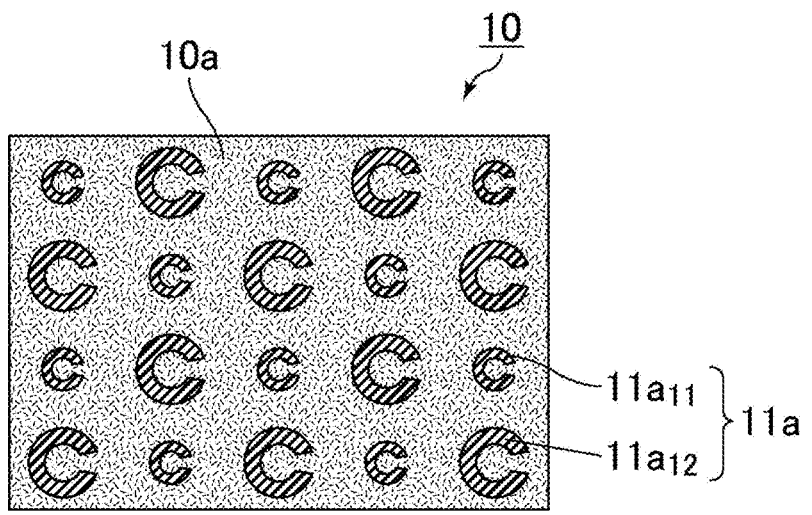
FIG. 3B is a schematic plan view of an example of predetermined patterns in the electromagnetic wave shielding film according to the first embodiment of the present invention.

In the electromagnetic wave shielding film of the present invention, as shown in FIG. 3B, each predetermined pattern 11a includes a C-shaped pattern $11a_{11}$ and a C-shaped pattern $11a_{12}$ larger than the pattern $11a_{11}$. The patterns $11a_{11}$ and the patterns $11a_{12}$ are arranged such that they are alternately positioned at the vertices of square cells.

In this aspect, a single pattern $11a_{11}$ and a single pattern $11a_{12}$ are combined together to define one predetermined pattern 11a. In other words, in this case, combinations of the patterns $11a_{11}$ and the patterns $11a_{12}$ are periodically arranged horizontally and vertically.

Figure 3C:
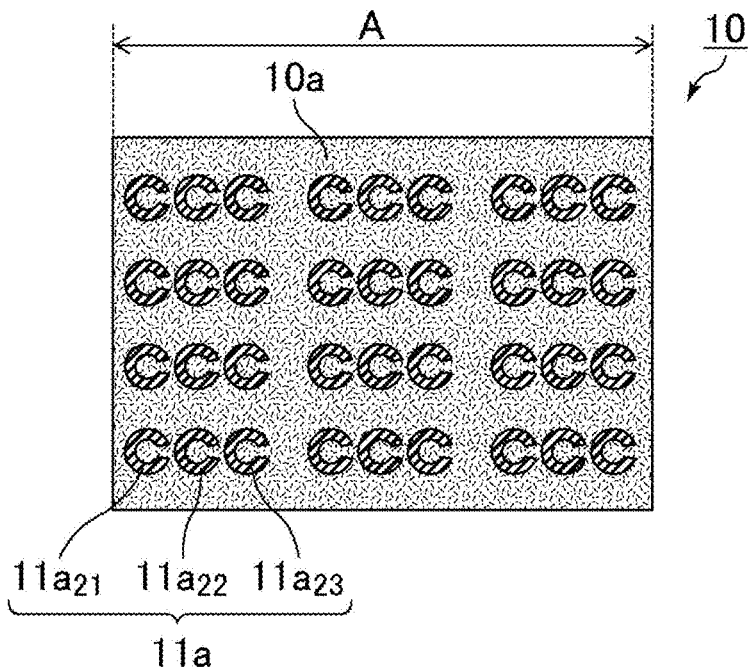
FIG. 3C is a schematic plan view of an example of predetermined patterns in the electromagnetic wave shielding film according to the first embodiment of the present invention.

In the electromagnetic wave shielding film of the present invention, as shown in FIG. 3C, each predetermined pattern 11a may include three patterns, i.e., a C-shaped pattern $11a_{21}$, a pattern $11a_{22}$, and a pattern $11a_{23}$ each having the same shape, that are consecutively lined up in a horizontal direction (the direction indicated by a double-headed arrow A in FIG. 3C). Such predetermined patterns 11a may be periodically arranged.

In this aspect, a combination of three patterns including a single pattern $11a_{21}$, a single pattern $11a_{22}$, and a single pattern $11a_{23}$ that are consecutively lined up in a horizontal direction defines one predetermined pattern 11a.

In the electromagnetic wave shielding film 1, each predetermined pattern 11a may have any thickness, but when the predetermined pattern 11a is made of a material such as copper, silver, aluminum, or carbon, the thickness is preferably 0.1 to 35 µm, more preferably 6 to 18 µm. When the predetermined pattern 11a is made of a conductive paste containing any of these materials, the thickness is preferably 5 to 100 µm, more preferably 10 to 60 µm.

Sufficient shielding properties are not easily obtained when each predetermined pattern has a thickness less than the above thickness.

The predetermined pattern having a thickness more than the above thickness is less flexible and easily breakable or separated from the non-conductive sheet when the electromagnetic wave shielding film is bent.

In the electromagnetic wave shielding film 1, the non-conductive sheet 12a may be made of any resin composition. Examples include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition, and thermosetting resin compositions such as a phenolic resin composition, an epoxy resin composition, a urethane resin composition, a melamine resin composition, and an alkyd resin composition.

The material of the resin composition may include one of these alone or two or more of these in combination.

In the electromagnetic wave shielding film 1, the non-conductive sheet 12a may include portions with a different type of resin composition. Such an aspect is described below with reference to the drawing.

Figure 4:
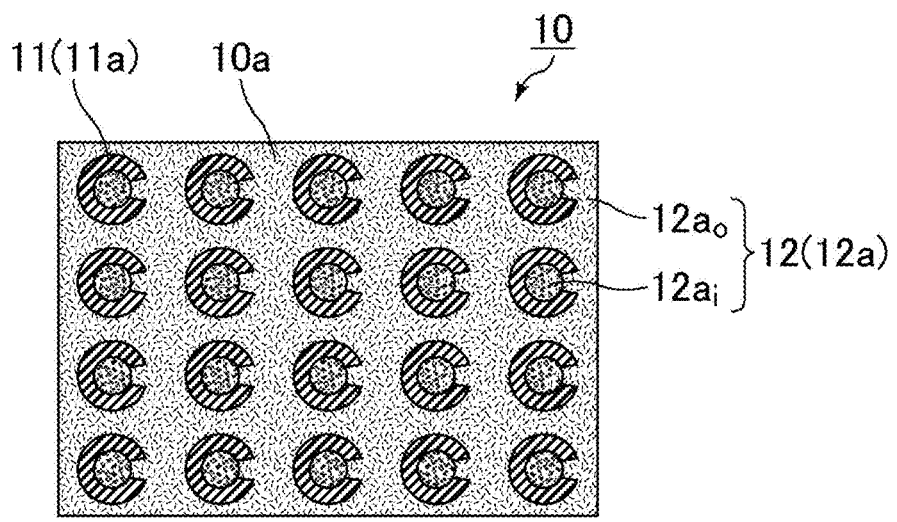
FIG. 4 is a schematic plan view of another example of the metamaterial layer of the electromagnetic wave shielding film according to the first embodiment of the present invention, viewed from the first main surface of the metamaterial layer.

In the metamaterial layer 10 shown in FIG. 4, the predetermined C-shaped patterns 11a are formed in the non-conductive sheet 12a.

The non-conductive sheet 12a includes portions $12a_i$ inside the predetermined C-shaped patterns 11a and portions $12a_o$ other than the portions $12a_i$. In FIG. 4, the type of resin composition in each portion $12a_i$ is different from the type of resin composition in each portion $12a_o$.

When the non-conductive sheet 12a includes portions with a different type of resin composition as described above, the relative permittivity of the non-conductive sheet 12a can be varied in some portions so that the frequency of an electromagnetic wave to be blocked can be controlled.

In the electromagnetic wave shielding film 1, the relative permittivity of the resin composition is preferably 1 to 20000, more preferably 10 to 1000.

An electromagnetic wave with a desired frequency can be blocked by adjusting the relative permittivity of the resin composition.

As shown in FIG. 4, in the non-conductive sheet 12a, when the type of resin composition in the portions $12a_i$ inside the predetermined C-shaped patterns 11a are different from the type of resin composition in the portions $12a_o$ other than the portions $12a_i$, the relative permittivity of the resin composition in the portions $12a_i$ is preferably 10 to 1000, and the relative permittivity of the resin composition in the portions $12a_o$ is preferably 10 to 1000.

Such a resin composition may be a ferroelectric resin composition. Examples of the ferroelectric include resin compositions containing liquid crystal materials described in paragraphs [0027] to [0037] of Japanese Patent Application No. 2016-26840, resin compositions containing organic ferroelectric materials described in paragraphs [0009] to [0016] and [0021] to [0024] of Japanese Patent Application No. 2004-341035, and resin compositions containing ferroelectric substances described in paragraphs [0007] and [0015] to [0020] of Japanese Patent Application No. 2003-320695.

In the electromagnetic wave shielding film 1, preferably, the thickness of the non-conductive sheet 12a is one to three times that of each predetermined pattern 11a.

The non-conductive sheet having a thickness less than the thickness of each predetermined pattern is weak and easily breakable.

The conductive sheet having a thickness more than three times the thickness of each predetermined pattern results in a decrease in the flexibility of the metamaterial layer and also results in an increase in the size of the electromagnetic wave shielding film as a whole, making it difficult to place the electromagnetic wave shielding film.

In the electromagnetic wave shielding film 1, preferably, the resin composition contains a filler, and preferably, the filler is an organic filler and/or an inorganic filler.

The presence of a functional filler in the resin composition can improve the dissipative properties and shielding properties of the metamaterial layer. The filler also functions as a filling agent.

Examples of the organic filler include particles of a melamine resin, a phenolic resin, a fluororesin, a urethane resin, a silicone resin, and the like.

Examples of the inorganic filler include particles of nitrogen compounds (boron nitride, aluminum nitride, silicon nitride, carbon nitride, titanium nitride, etc.), carbon compounds (silicon carbide, fluorine carbide, boron carbide, titanium carbide, tungsten carbide, diamond, etc.), and metal oxides (silica, alumina, magnesium oxide, zinc oxide, beryllium oxide, etc.); glass beads; and glass fibers.

In the electromagnetic wave shielding film 1, the adhesive layer 20 may be a non-conductive adhesive layer or a conductive adhesive layer, but is preferably a conductive adhesive layer.

The electromagnetic wave shielding film 1 is intended to be placed on a printed wiring board.

Here, when the adhesive layer 20 is a conductive adhesive layer, connecting the adhesive layer 20 to a ground circuit of the printed wiring board can establish an electrical connection between the conductive region of the metamaterial layer and the ground circuit. This, as a result, can improve the shielding properties of the electromagnetic wave shielding film 1.

When the adhesive layer 20 is a conductive adhesive layer, the conductive adhesive layer may be an isotropic conductive adhesive layer or an anisotropic conductive adhesive layer.

When the adhesive layer 20 is a conductive adhesive layer, preferably, the adhesive layer 20 contains an adhesive resin composition and conductive particles.

Any conductive particles, such as metal fine particles, carbon nanotubes, carbon fibers, and metal fibers, may be used.

The adhesive resin composition may be made of any material. Examples include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition, and thermosetting resin compositions such as a phenolic resin composition, an epoxy resin composition, a urethane resin composition, a melamine resin composition, and an alkyd resin composition.

The material of the adhesive resin composition may include one of these alone or two or more of these in combination.

Preferably, the electromagnetic wave shielding film 1 can specifically block an electromagnetic wave with a frequency of 0.1 to 90 GHz. More preferably, the electromagnetic wave shielding film 1 can specifically block an electromagnetic wave with a frequency of 1 to 30 GHz.

Next, another aspect of the first embodiment of the present invention is described.

Figure 5A:
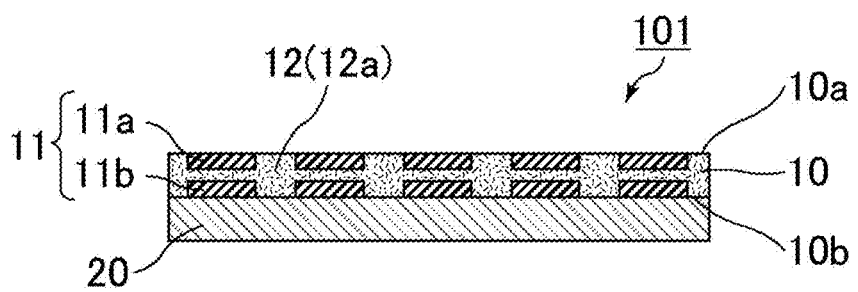
FIG. 5A is a schematic cross-sectional view of an example of the electromagnetic wave shielding film according to the first embodiment of the present invention.
Figure 5B:
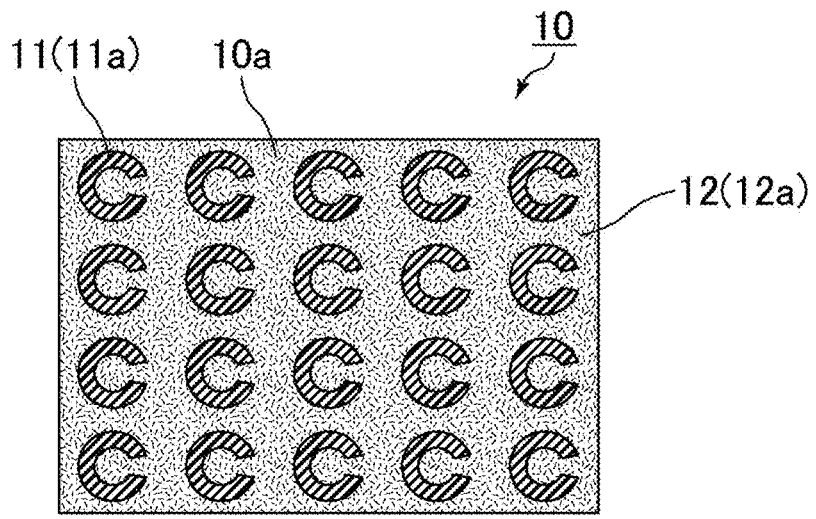
FIG. 5B is a schematic plan view of an example of the metamaterial layer of the electromagnetic wave shielding film according to the first embodiment of the present invention, viewed from the first main surface of the metamaterial layer.
Figure 5C:
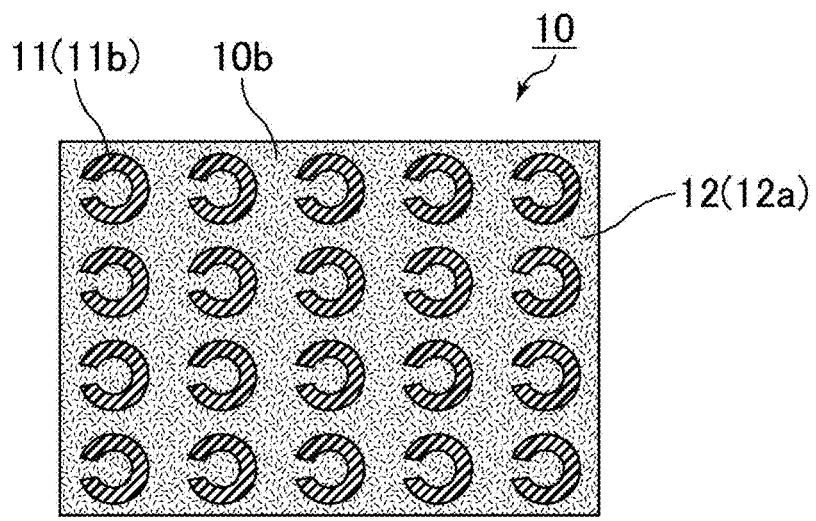
FIG. 5C is a schematic plan view of an example of the metamaterial layer of the electromagnetic wave shielding film according to the first embodiment of the present invention, viewed from a second main surface of the metamaterial layer.

An electromagnetic wave shielding film 101 shown in FIG. 5A, FIG. 5B, and FIG. 5C has the same configuration as the electromagnetic wave shielding film 1, except that predetermined patterns 11b made of a conductive material are also periodically arranged adjacent to the second main surface 10b of the metamaterial layer 10.

As shown in FIG. 5C, in the electromagnetic wave shielding film 101, the predetermined patterns 11b are C-shaped and arranged such that they are positioned at the vertices of square cells.

Each predetermined pattern 11a has a shape that is a horizontally flipped version of the shape of each predetermined pattern 11b.

The non-conductive sheet 12a is present between the predetermined patterns 11a and the predetermined patterns 11b.

The electromagnetic wave shielding film according to such an aspect can also block an electromagnetic wave with a desired frequency.

In the electromagnetic wave shielding film of the present invention, the predetermined patterns 11a and the predetermined patterns 11b have the same shape. The predetermined patterns 11a may be continuous with the respective predetermined patterns 11b in the thickness direction of the metamaterial layer 10. In other words, the conductive material forming the predetermined patterns may penetrate through the non-conductive sheet.

In the electromagnetic wave shielding film of the present invention, the predetermined patterns 11a may be continuous with the respective predetermined patterns 11b, with their shapes changing over the course from the first main surface 10a to the second main surface 10b of the metamaterial layer 10. Examples of such shapes include a split ring shape.

In the electromagnetic wave shielding film of the present invention, the shape and arrangement of the predetermined patterns 11a may be different from the shape and arrangement of the predetermined patterns 11b.

Next, still another aspect of the first embodiment of the present invention is described.

Figure 6:
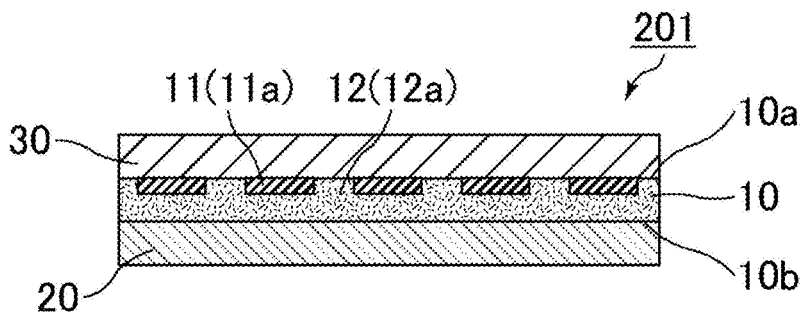
FIG. 6 is a schematic cross-sectional view of an example of the electromagnetic wave shielding film according to the first embodiment of the present invention.

An electromagnetic wave shielding film 201 shown in FIG. 6 has the same configuration as the electromagnetic wave shielding film 1, except that a protective layer 30 is formed on the first main surface 10a of the metamaterial layer 10.

The protective layer 30, when formed on the first main surface 10a of the metamaterial layer 10, can prevent the metamaterial layer 10 and the adhesive layer 20 from being damaged by external impact or the like.

The protective layer 30 also improves handling because the electromagnetic wave shielding film can be carried, for example, without touching either the metamaterial layer 10 or the adhesive layer 20.

Any protective layer 30 that can protect the metamaterial layer 10 and the adhesive layer 20 may be used. Preferably, the protective layer 30 is made of, for example, a thermoplastic resin composition, a thermosetting resin composition, an active energy ray curable composition, a resin film, or the like.

Any thermoplastic resin composition may be used. Examples include a styrene resin composition, a vinyl acetate resin composition, a polyester resin composition, a polyethylene resin composition, a polypropylene resin composition, an imide resin composition, and an acrylic resin composition.

Any thermosetting resin composition may be used. Examples include a phenolic resin composition, an epoxy resin composition, a urethane resin composition, a melamine resin composition, and an alkyd resin composition.

Any active energy ray curable composition may be used. Examples include a polymerizable compound having at least two (meth)acryloyloxy groups in one molecule.

Any resin film may be used. Examples include polyphenylene sulfide (PPS) films, polyimide (PI) films, polyethylene naphthalate (PEN) films, polyethylene terephthalate (PET) films, cycloolefin polymer (COP) films, and polyetheretherketone (PEEK) films.

The protective layer 30 may be made of one material alone or two or more materials.

The protective layer 30 may contain, as necessary, a hardening accelerator, a tackifier, an antioxidant, a pigment, a dye, a plasticizer, an ultraviolet absorber, an antifoam agent, a leveling agent, a filling agent, a flame retardant, a viscosity modifier, an antiblocking agent, or the like.

The thickness of the protective layer 30 is not limited and can be suitably set as necessary, but it is preferably 1 to 15 μm, more preferably 3 to 10 μm.

The protective layer 30 having a thickness less than 1 μm is too thin to sufficiently protect the metamaterial layer 10 and the adhesive layer 20.

The protective layer 30 having a thickness more than 15 μm is too thick so that the electromagnetic wave shielding film 1 is not easily bendable and the protective layer 30 itself is easily breakable. This makes the protective layer less applicable to a member that requires bending resistance.

Next, still another aspect of the first embodiment of the present invention is described.

Figure 7A:
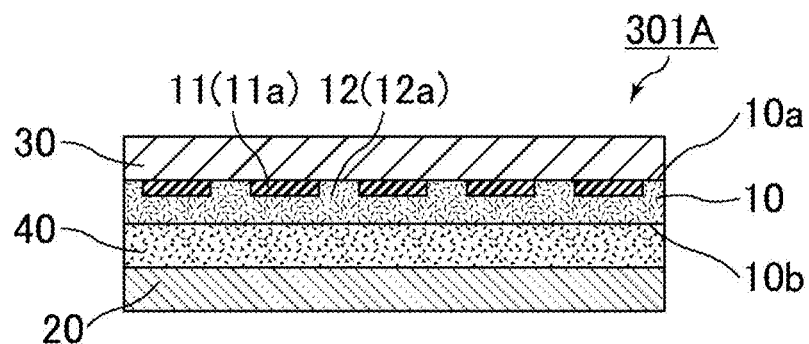
FIG. 7A is a schematic cross-sectional view of an example of the electromagnetic wave shielding film according to the first embodiment of the present invention.

An electromagnetic wave shielding film 301A shown in FIG. 7A has the same configuration as the electromagnetic wave shielding film 201, except a conductive layer 40 is formed between the adhesive layer 20 and the metamaterial layer 10.

Figure 7B:
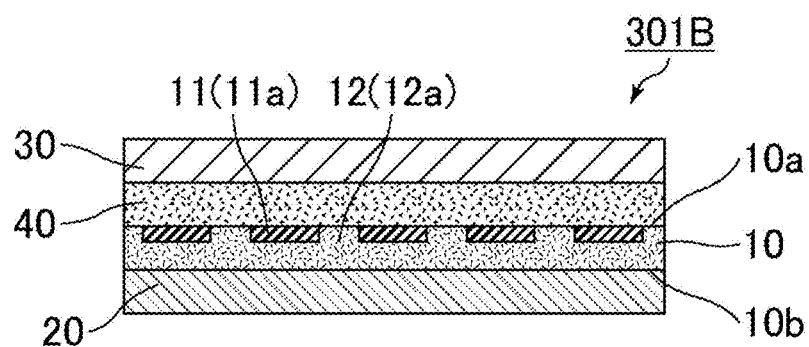
FIG. 7B is a schematic cross-sectional view of an example of the electromagnetic wave shielding film according to the first embodiment of the present invention.

An electromagnetic wave shielding film 301B shown in FIG. 7B has the same configuration as the electromagnetic wave shielding film 201, except the conductive layer 40 is formed between the metamaterial layer 10 and the protective layer 30.

The conductive layer 40, when formed as described above, functions as a shielding layer, improving the shielding properties of the electromagnetic wave shielding film as a whole.

The conductive layer 40 may be made of a metal layer or a conductive adhesive layer.

When the conductive layer 40 is made of a metal layer, preferably, the metal layer contains at least one metal selected from the group consisting of copper, silver, gold, aluminum, nickel, tin, palladium, chromium, titanium, and zinc.

These metals are suitable for the shielding layer of the electromagnetic wave shielding film.

Such a metal layer can be formed by a method such as placing metal foil, plating, or vapor deposition.

When the conductive layer 40 is a conductive adhesive layer, preferably, the conductive adhesive layer contains conductive particles and an adhesive resin composition.

Any conductive particles, such as metal fine particles, carbon nanotubes, carbon fibers, and metal fibers, may be used.

The adhesive resin composition may be made of any material. Examples include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition, and thermosetting resin compositions such as a phenolic resin composition, an epoxy resin composition, a urethane resin composition, a melamine resin composition, and an alkyd resin composition.

The material of the adhesive resin composition may include one of these alone or two or more of these in combination.

Such a conductive adhesive layer can be formed by mixing conductive particles and an adhesive resin composition to obtain a mixture and applying the mixture with a bar coater or the like.

The thickness of the conductive layer 40 is preferably 0.01 to 60 μm, more preferably 0.1 to 20 μm.

The conductive layer having a thickness less than 0.01 μm is too thin, resulting in a decrease in the strength of the shielding layer. Thus, the bending resistance is reduced. It also makes it difficult to sufficiently reflect and absorb electromagnetic waves, resulting in poor shielding properties.

The conductive layer having a thickness more than 60 μm results in an increase in the thickness of the electromagnetic wave shielding film as a whole, making it difficult to handle the electromagnetic wave shielding film.

In each of the electromagnetic wave shielding film 301A and the electromagnetic wave shielding film 301B, the conductive layer 40 is formed either between the adhesive layer 20 and the metamaterial layer 10 or between the metamaterial layer 10 and the protective layer 30.

Yet, in the electromagnetic wave shielding film of the present invention, one conductive layer 40 may be formed between the adhesive layer 20 and the metamaterial layer 10, and another conductive layer 40 may be formed between the metamaterial layer 10 and the protective layer 30.

The electromagnetic wave shielding film 301A and the electromagnetic wave shielding film 301B each include the protective layer 30. Yet, the electromagnetic wave shielding film of the present invention may not include a protective layer and may include only the metamaterial layer 10, the adhesive layer 20, and the conductive layer 40.

The electromagnetic wave shielding film 301A and the electromagnetic wave shielding film 301B each include the conductive layer 40. Yet, the electromagnetic wave shielding film of the present invention may include a magnetic layer instead of the conductive layer 40. Such a magnetic layer functions as a shielding layer, improving the shielding properties of the electromagnetic wave shielding film as a whole.

The magnetic layer may be one obtained by molding a soft magnetic material such as iron, silicon iron, permalloy, soft ferrite, sendust, permendur, or the like into a sheet shape or one obtained by molding a mixture of soft magnetic material powder and a resin into a sheet shape.

The electromagnetic wave shielding film according to the first embodiment of the present invention which has been described so far includes only one metamaterial layer. Yet, the electromagnetic wave shielding film according to the first embodiment of the present invention may include multiple metamaterial layers. As long as at least one metamaterial layer is included, the electromagnetic wave shielding film according to the first embodiment of the present invention may include an additional functional layer stacked on the metamaterial layer.

Examples of such a functional layer include a high dielectric layer. Such a high dielectric layer, when included, can adjust the resonant frequency and block an electromagnetic wave with a desired frequency.

Second Embodiment

Next, an electromagnetic wave shielding film according to a second embodiment of the present invention is described.

Figure 8A:
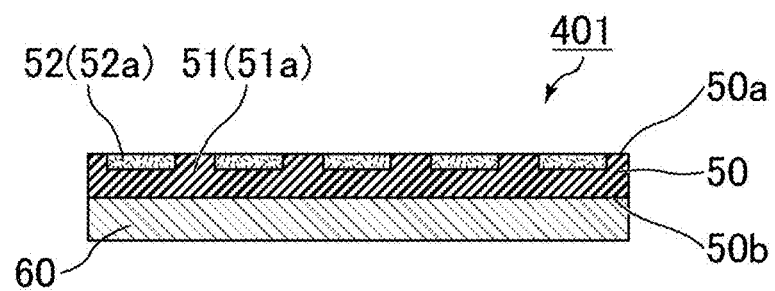
FIG. 8A is a schematic cross-sectional view of an example of an electromagnetic wave shielding film according to a second embodiment of the present invention.

An electromagnetic wave shielding film 401 shown in FIG. 8A includes a metamaterial layer 50 including a first main surface 50a and a second main surface 50b opposite to the first main surface 50a, and an adhesive layer 60 formed on the second main surface 50b of the metamaterial layer 50.

Figure 8B:
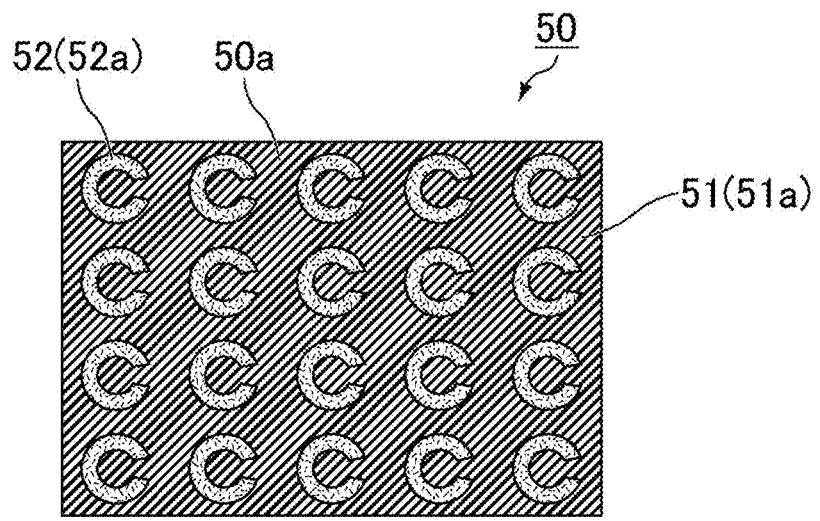
FIG. 8B is a schematic plan view of a metamaterial layer of the electromagnetic wave shielding film according to the second embodiment of the present invention, viewed from a first main surface of the metamaterial layer.
Figure 9A:
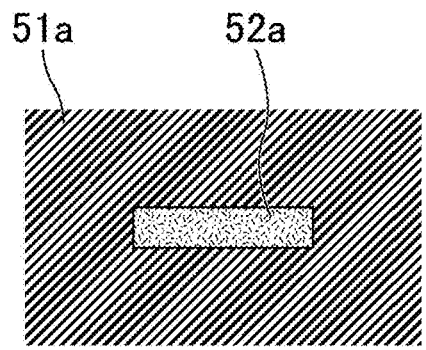
FIG. 9A is a schematic plan view of an example shape of a predetermined pattern made of a non-conductive material in the electromagnetic wave shielding film according to the second embodiment of the present invention.
Figure 9B:
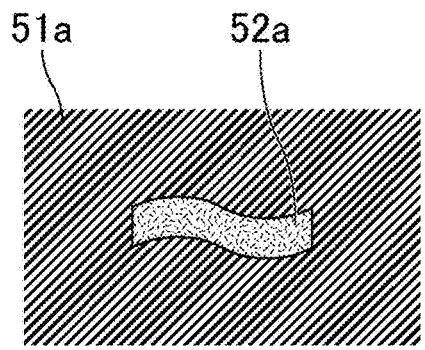
FIG. 9B is a schematic plan view of an example shape of a predetermined pattern made of a non-conductive material in the electromagnetic wave shielding film according to the second embodiment of the present invention.
Figure 9C:
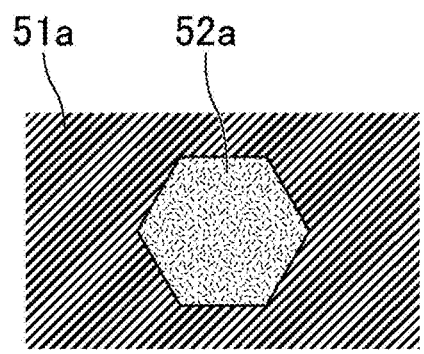
FIG. 9C is a schematic plan view of an example shape of a predetermined pattern made of a non-conductive material in the electromagnetic wave shielding film according to the second embodiment of the present invention.
Figure 9D:
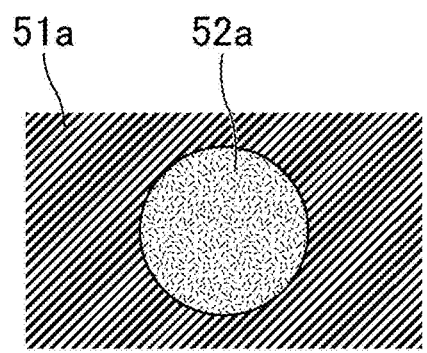
FIG. 9D is a schematic plan view of an example shape of a predetermined pattern made of a non-conductive material in the electromagnetic wave shielding film according to the second embodiment of the present invention.
Figure 9E:
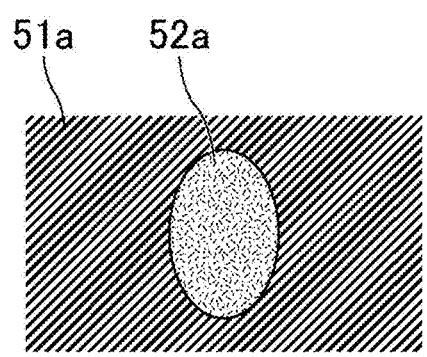
FIG. 9E is a schematic plan view of an example shape of a predetermined pattern made of a non-conductive material in the electromagnetic wave shielding film according to the second embodiment of the present invention.
Figure 9F:
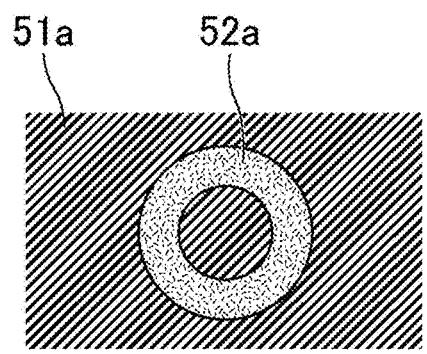
FIG. 9F is a schematic plan view of an example shape of a predetermined pattern made of a non-conductive material in the electromagnetic wave shielding film according to the second embodiment of the present invention.
Figure 9G:
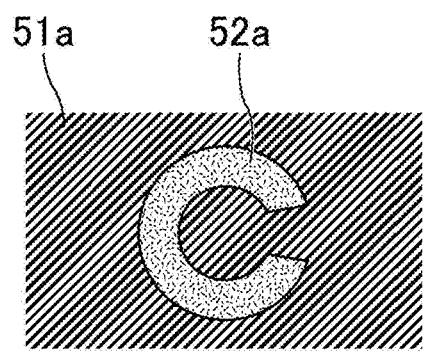
FIG. 9G is a schematic plan view of an example shape of a predetermined pattern made of a non-conductive material in the electromagnetic wave shielding film according to the second embodiment of the present invention.
Figure 9H:
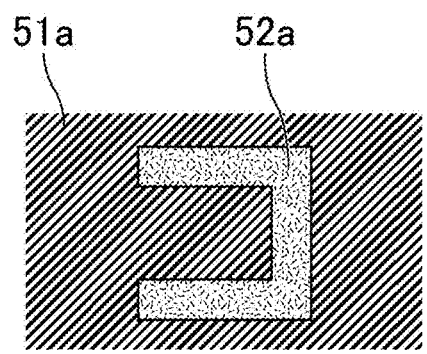
FIG. 9H is a schematic plan view of an example shape of a predetermined pattern made of a non-conductive material in the electromagnetic wave shielding film according to the second embodiment of the present invention.
Figure 9I:
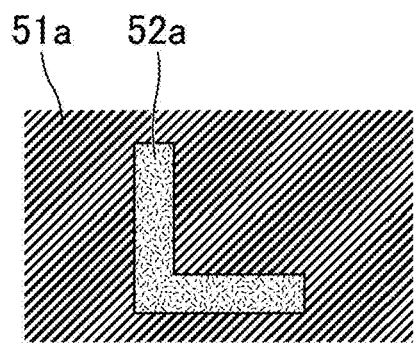
FIG. 9I is a schematic plan view of an example shape of a predetermined pattern made of a non-conductive material in the electromagnetic wave shielding film according to the second embodiment of the present invention.
Figure 9J:
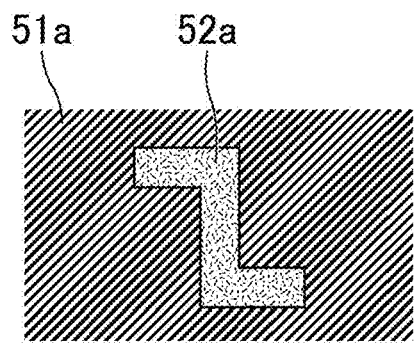
FIG. 9J is a schematic plan view of an example shape of a predetermined pattern made of a non-conductive material in the electromagnetic wave shielding film according to the second embodiment of the present invention.
Figure 9K:
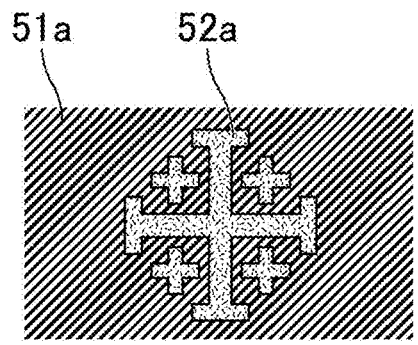
FIG. 9K is a schematic plan view of an example shape of a predetermined pattern made of a non-conductive material in the electromagnetic wave shielding film according to the second embodiment of the present invention.

As shown in FIG. 8A and FIG. 8B, the metamaterial layer 50 includes a non-conductive region 52 and a conductive region 51 other than the non-conductive region 52.

The non-conductive region 52 is where predetermined patterns 52a made of a non-conductive material are periodically arranged.

As shown in FIG. 8A and FIG. 8B, in the electromagnetic wave shielding film 401, the predetermined patterns 52a are C-shaped and arranged such that they are positioned at the vertices of square cells.

In the electromagnetic wave shielding film 401, the metamaterial layer 50 includes the non-conductive region 52 where the predetermined patterns 52a made of a non-conductive material are periodically arranged, and the conductive region 51 other than the non-conductive region 52.

In the electromagnetic wave shielding film 401, the conductive region 51 functions as a shielding layer.

A periodical arrangement of the predetermined patterns 52a made of a non-conductive material allows resonance with an electromagnetic field with a specific frequency and allows passage of an electromagnetic wave with a specific frequency.

As shown in FIG. 8A, in the electromagnetic wave shielding film 401, the conductive region 51 includes a conductive sheet 51a, and the predetermined patterns 52a are embedded in the conductive sheet 51a.

As shown in FIG. 8A, in the electromagnetic wave shielding film 401, the predetermined patterns 52a are formed only adjacent to the first main surface 50a of the metamaterial layer 50 but not adjacent to the second main surface 50b.

The metamaterial layer 50 according to such an aspect can be easily formed by embedding the predetermined patterns 52a in the conductive sheet 51a.

Such predetermined patterns 52a can be formed by forming recesses having a predetermined shape in the surface of the conductive sheet 51a by etching or the like and filling the recesses with a non-conductive material, for example.

The frequency of an electromagnetic wave to pass through the electromagnetic wave shielding film 401 can be controlled by adjusting the material, shape, size, arrangement, and period of the predetermined patterns 52a, the dielectric constant of the non-conductive material, and the like.

In the electromagnetic wave shielding film 401, the predetermined patterns 52a may be made of any non-conductive material. Examples include thermoplastic resin compositions such as a styrene resin composition, a vinyl acetate resin composition, a polyester resin composition, a polyethylene resin composition, a polypropylene resin composition, an imide resin composition, an amide resin composition, and an acrylic resin composition, and thermosetting resin compositions such as a phenolic resin composition, an epoxy resin composition, a urethane resin composition, a melamine resin composition, and an alkyd resin composition.

The non-conductive material made of a resin composition may include one of these alone or two or more of these in combination.

In the electromagnetic wave shielding film 401, the relative permittivity of the non-conductive material is preferably 1 to 20000, more preferably 10 to 1000.

An electromagnetic wave with a desired frequency can be blocked by adjusting the relative permittivity of the non-conductive material.

In the electromagnetic wave shielding film 401, preferably, the resin composition includes a filler, and preferably, the filler is an organic filler and/or an inorganic filler.

The presence of a functional filler in the resin composition can improve the dissipative properties and shielding properties of the metamaterial layer. The filler also functions as a filling agent.

Examples of the organic filler include particles of a melamine resin, a phenolic resin, a fluororesin, a urethane resin, a silicone resin, and the like.

Examples of the inorganic filler include particles of nitrogen compounds (boron nitride, aluminum nitride, silicon nitride, carbon nitride, titanium nitride, etc.), carbon compounds (silicon carbide, fluorine carbide, boron carbide, titanium carbide, tungsten carbide, diamond, etc.), and metal oxides (silica, alumina, magnesium oxide, zinc oxide, beryllium oxide, etc.); glass beads; and glass fibers.

In the electromagnetic wave shielding film 401, the predetermined patterns 52a are C-shaped. Yet, in the electromagnetic wave shielding film of the present invention, as shown in FIGS. 9A to 9K, preferably, the predetermined patterns 52a include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

Use of such a pattern allows passage of an electromagnetic wave with a desired frequency.

In the electromagnetic wave shielding film 401 shown in FIG. 8B, the predetermined C-shaped patterns 52a each having the same shape are positioned at the vertices of square cells.

Yet, in the electromagnetic wave shielding film of the present invention, the predetermined patterns may be arranged in any manner as long as they are periodically arranged.

For example, the predetermined patterns 52a may be periodically arranged such that they are positioned at the vertices of equilateral triangles laid out on the plane.

The predetermined patterns 52a of similar but different sizes may be arranged such that they are alternately positioned at the vertices of square cells.

Multiple patterns may be combined to define a predetermined pattern, and such predetermined patterns may be periodically arranged.

In the electromagnetic wave shielding film 401, the thickness of each predetermined pattern 52a is preferably 0.1 to 35 µm, more preferably 6 to 18 µm.

The predetermined pattern having a thickness less than 0.1 µm make it difficult for an electromagnetic wave with a desired frequency to pass through the electromagnetic wave shielding film.

The predetermined pattern having a thickness more than 35 µm is less flexible and easily breakable or separated from the conductive sheet when the electromagnetic wave shielding film is bent.

In the electromagnetic wave shielding film 401, the conductive sheet 51a may be made of any material, but a material such as copper, silver, aluminum, or carbon is preferred.

In the electromagnetic wave shielding film 401, preferably, the thickness of the conductive sheet 51a is one to three times that of each predetermined pattern 52a.

The conductive sheet having a thickness less than the thickness of each predetermined pattern is weak and easily breakable.

The conductive sheet having a thickness more than three times the thickness of each predetermined pattern results in a decrease in the flexibility of the metamaterial layer and also results in an increase in the size of the electromagnetic wave shielding film as a whole, making it difficult to place the electromagnetic wave shielding film. Further, an electromagnetic wave with a desired frequency cannot easily pass through the electromagnetic wave shielding film.

A preferred aspect of the adhesive layer 60 in the electromagnetic wave shielding film 401 is the same as the preferred aspect of the adhesive layer 20 in the electromagnetic wave shielding film 1.

Preferably, the electromagnetic wave shielding film 401 specifically allows passage of an electromagnetic wave with a frequency of 0.1 to 90 GHz. More preferably, the electromagnetic wave shielding film 1 specifically allows passage of an electromagnetic wave with a frequency of 1 to 30 GHz.

Next, another aspect of the second embodiment of the present invention is described.

Figure 10A:
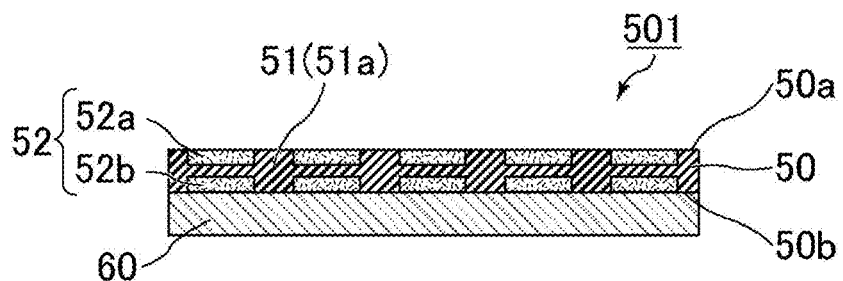
FIG. 10A is a schematic cross-sectional view of an example of the electromagnetic wave shielding film according to the second embodiment of the present invention.
Figure 10B:
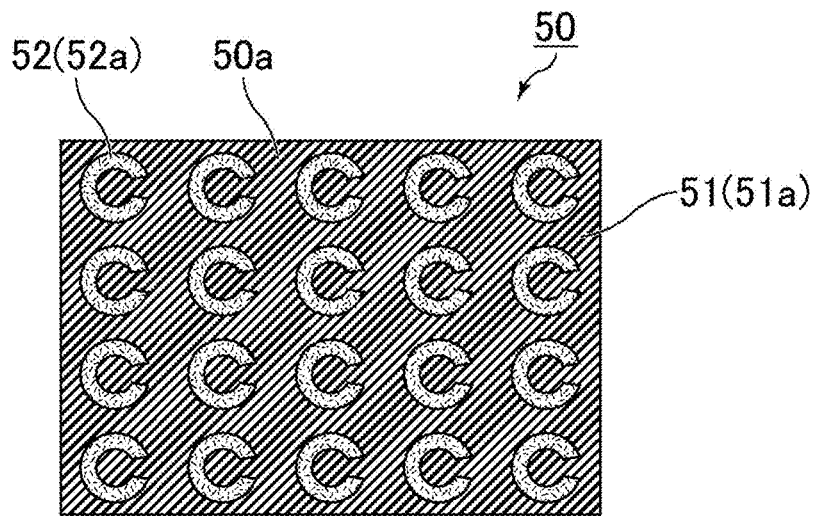
FIG. 10B is a schematic plan view of the metamaterial layer of the electromagnetic wave shielding film according to the second embodiment of the present invention, viewed from the first main surface of the metamaterial layer.
Figure 10C:
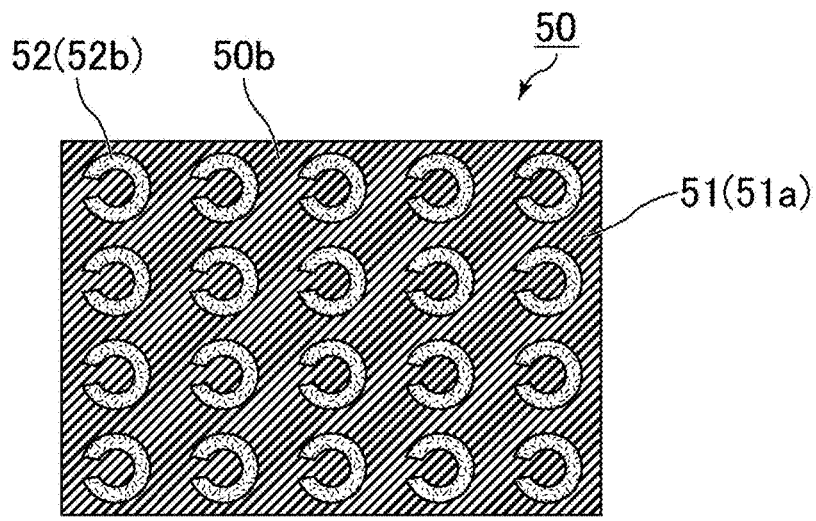
FIG. 10C is a schematic plan view of the metamaterial layer of the electromagnetic wave shielding film according to the second embodiment of the present invention, viewed from a second main surface of the metamaterial layer.

An electromagnetic wave shielding film 501 shown in FIG. 10A, FIG. 10B, and FIG. 10C has the same configuration as the electromagnetic wave shielding film 401, except that predetermined patterns 52b made of a conductive material are also periodically arranged adjacent to the second main surface 50b of the metamaterial layer 50.

As shown in FIG. 10C, in the electromagnetic wave shielding film 501, the predetermined patterns 52b are C-shaped and arranged such that they are positioned at the vertices of square cells.

Each predetermined pattern 52b has a shape that is a horizontally flipped version of the shape of each predetermined pattern 52b.

The conductive sheet 51a is present between the predetermined patterns 52a and the predetermined patterns 52b.

The electromagnetic wave shielding film according to such an aspect can also block an electromagnetic wave with a desired frequency.

In the electromagnetic wave shielding film of the present invention, the predetermined patterns 52a and the predetermined patterns 52b have the same shape. The predetermined patterns 52a may be continuous with the respective predetermined patterns 52b in the thickness direction of the metamaterial layer 50. In other words, the non-conductive material forming the predetermined patterns may penetrate through the conductive sheet.

In the electromagnetic wave shielding film of the present invention, the predetermined patterns 52a may be continuous with the respective predetermined patterns 52b, with their shapes changing over the course from the first main surface 50a to the second main surface 50b of the metamaterial layer 50. Examples of such shapes include a split ring shape.

In the electromagnetic wave shielding film of the present invention, the shape and arrangement of the predetermined patterns 52a may be different from the shape and arrangement of the predetermined patterns 52b.

Next, still another aspect of the second embodiment of the present invention is described.

Figure 11A:
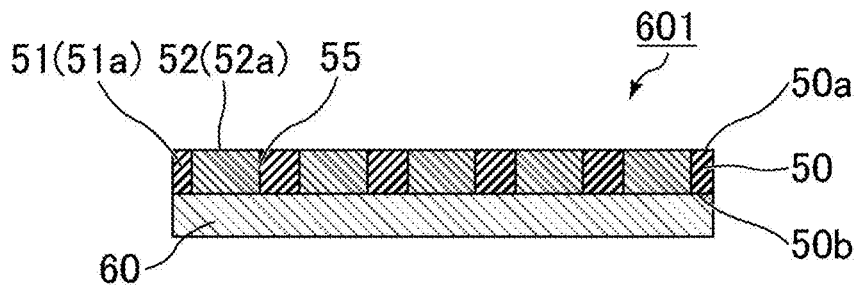
FIG. 11A is a schematic cross-sectional view of an example of the electromagnetic wave shielding film according to the second embodiment of the present invention.
Figure 11B:
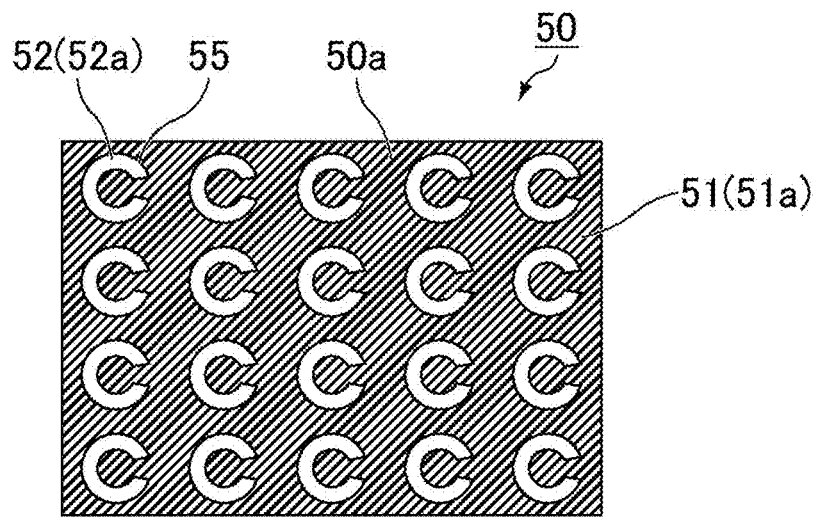
FIG. 11B is a schematic plan view of the metamaterial layer of the electromagnetic wave shielding film according to the second embodiment of the present invention, viewed from the first main surface of the metamaterial layer.

An electromagnetic wave shielding film 601 shown in FIG. 11A and FIG. 11B includes the metamaterial layer 50 including the first main surface 50a and the second main surface 50b opposite to the first main surface 50a, and the adhesive layer 60 formed on the second main surface 50b of the metamaterial layer 50.

The metamaterial layer 50 includes through holes 55 penetrating from the first main surface 50a to the second main surface 50b.

As shown in FIG. 11A and FIG. 11B, the metamaterial layer 50 includes the non-conductive region 52 and the conductive region 51 other than the non-conductive region 52.

The non-conductive region 52 is where the predetermined patterns 52a are periodically arranged.

The predetermined patterns 52a are outlined with the through holes 55.

In the metamaterial layer 50, the through holes 55 are filled with air. Thus, the predetermined patterns 52a is considered to be made of air which is a non-conductive material.

As shown in FIG. 11B, in the electromagnetic wave shielding film 601, the predetermined patterns 52a are C-shaped and arranged such that they are positioned at the vertices of square cells.

In the electromagnetic wave shielding film 601 according to such an aspect, electromagnetic waves are not easily reflected or absorbed in the through holes 55. This makes it easy for an electromagnetic wave with a specific frequency to suitably pass through the electromagnetic wave shielding film.

A preferred aspect of the adhesive layer 60 in the electromagnetic wave shielding film 601 is the same as the preferred aspect of the adhesive layer 60 in the electromagnetic wave shielding film 401.

Next, still another aspect of the second embodiment of the present invention is described.

Figure 12:
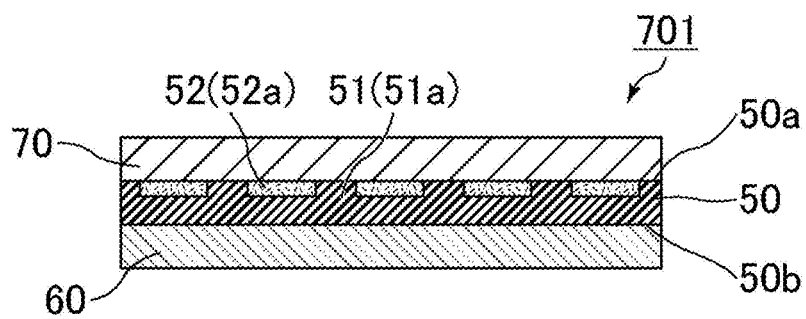
FIG. 12 is a schematic cross-sectional view of an example of the electromagnetic wave shielding film according to the second embodiment of the present invention.

An electromagnetic wave shielding film 701 shown in FIG. 12 has the same configuration as the electromagnetic wave shielding film 401, except that a protective layer 70 is formed on the first main surface 50a of the metamaterial layer 50.

The protective layer 70, when formed on the first main surface 50a of the metamaterial layer 50, can prevent the metamaterial layer 50 and the adhesive layer 60 from being damaged by external impact or the like.

The protective layer 70 also improves handling because the electromagnetic wave shielding film can be carried, for example, without touching either the metamaterial layer 50 or the adhesive layer 60.

A preferred aspect of the protective layer 70 in the electromagnetic wave shielding film 701 is the same as the preferred aspect of the protective layer 30 in the electromagnetic wave shielding film 201.

Next, still another aspect of the second embodiment of the present invention is described.

Figure 13A:
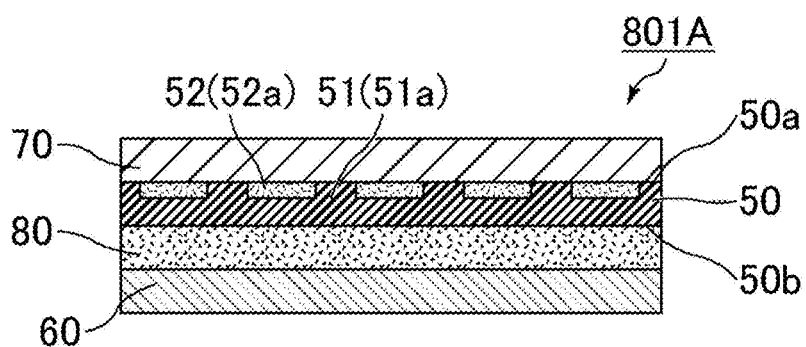
FIG. 13A is a schematic cross-sectional view of an example of the electromagnetic wave shielding film according to the second embodiment of the present invention.

An electromagnetic wave shielding film 801A shown in FIG. 13A has the same configuration as the electromagnetic wave shielding film 701, except that a conductive layer 80 is formed between the adhesive layer 60 and the metamaterial layer 50.

Figure 13B:
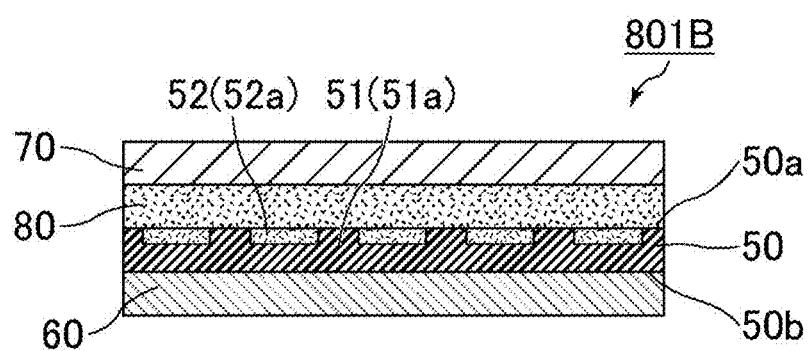
FIG. 13B is a schematic cross-sectional view of an example of the electromagnetic wave shielding film according to the second embodiment of the present invention.

An electromagnetic wave shielding film 801B shown in FIG. 13B has the same configuration as the electromagnetic wave shielding film 701, except the conductive layer 80 is formed between the metamaterial layer 50 and the protective layer 70.

The conductive layer 80, when formed, functions as a shielding layer, improving the shielding properties of the electromagnetic wave shielding film as a whole.

A preferred aspect of the conductive layer 80 in each of the electromagnetic wave shielding film 801A and the electromagnetic wave shielding film 801B is the same as the preferred aspect of the conductive layer 40 in the electromagnetic wave shielding film 201.

In each of the electromagnetic wave shielding film 801A and the electromagnetic wave shielding film 801B, the conductive layer 80 is formed either between the adhesive layer 60 and the metamaterial layer 50 or between the metamaterial layer 50 and the protective layer 70.

Yet, in the electromagnetic wave shielding film of the present invention, one conductive layer 80 may be formed between the adhesive layer 60 and the metamaterial layer 50, and another conductive layer 80 may be formed between the metamaterial layer 50 and the protective layer 70.

The electromagnetic wave shielding film 801A and the electromagnetic wave shielding film 801B each include the protective layer 70. Yet, the electromagnetic wave shielding film of the present invention may not include a protective layer and may include only the metamaterial layer 50, the adhesive layer 60, and the conductive layer 80.

The electromagnetic wave shielding film 801A and the electromagnetic wave shielding film 801B each include the conductive layer 80. Yet, the electromagnetic wave shielding film of the present invention may include a magnetic layer instead of the conductive layer 80. Such a magnetic layer functions as a shielding layer, improving the shielding properties of the electromagnetic wave shielding film as a whole.

The magnetic layer may be one obtained by molding a soft magnetic material such as iron, silicon iron, permalloy, soft ferrite, sendust, permendur, or the like into a sheet shape or one obtained by molding a mixture of soft magnetic material powder and a resin into a sheet shape.

The electromagnetic wave shielding film according to the second embodiment of the present invention which has been described so far includes only one metamaterial layer. Yet, the electromagnetic wave shielding film according to the second embodiment of the present invention may include multiple metamaterial layers. As long as at least one metamaterial layer is included, the electromagnetic wave shielding film according to the second embodiment of the present invention may include an additional functional layer stacked on the metamaterial layer.

Examples of such a functional layer include a high dielectric layer. Such a high dielectric layer, when included, can adjust the resonant frequency and allows passage of an electromagnetic wave with a desired frequency.

OTHER EMBODIMENTS

The electromagnetic wave shielding film according to the first embodiment of the present invention which has been described so far includes, as a metamaterial layer, the metamaterial layer (hereinafter also referred to as the "positive metamaterial layer") including the conductive region where the predetermined patterns made of a conductive material are periodically arranged, and the non-conductive region other than the conductive region.

In addition, the electromagnetic wave shielding film according to the second embodiment of the present invention which has been described so far includes, as a metamaterial layer, the metamaterial layer (hereinafter also referred to as the "negative metamaterial layer") including the non-conductive region where the predetermined patterns made of a non-conductive material are periodically arranged, and the conductive region other than the non-conductive region.

Yet, the electromagnetic wave shielding film of the present invention may include both a positive metamaterial layer and a negative metamaterial layer.

The electromagnetic wave shielding film of the present invention may include a stack of multiple positive metamaterial layers.

The electromagnetic wave shielding film of the present invention may include a stack of multiple negative metamaterial layers.

EXAMPLES

Hereinafter, the present invention is more specifically described with reference to Examples, but the present invention is not limited to these Examples.

Example 1

A 25-μm thick non-conductive sheet made of a polyimide composition and including a first main surface and a second main surface opposite to the first main surface was prepared. The relative permittivity of the non-conductive sheet was 3.1.

Next, a conductive paste ($8 \times 10^{-5}$ Ωcm) was printed on the first main surface of the non-conductive sheet to form C-shaped patterns (hereinafter also referred to as the "first C-shaped patterns") positioned at the vertices of square cells.

Each first C-shaped pattern had the same shape. Each first C-shaped pattern had a width (line thickness) of 1 mm and a full length (maximum width of the pattern) of 5 mm.

The distance between the centers of gravity of two adjacent first C-shaped patterns was 6 mm.

Next, a conductive paste ($8 \times 10^{-5}$ Ωcm) was printed on the second main surface of the non-conductive sheet to form C-shaped patterns (hereinafter also referred to as the "second C-shaped patterns") positioned at the back of the first C-shaped patterns.

Here, each second C-shaped pattern viewed from the first main surface had a shape that was a 180-degree rotated version of the shape of each first C-shaped pattern viewed from the first main surface.

Each second C-shaped pattern had the same shape. Each second C-shaped pattern had a width (line thickness) of 1 mm and a full length (maximum width of the pattern) of 5 mm.

A positive metamaterial layer according to Example 1 was produced through the above steps.

Here, the positional relationship between the elements of the metamaterial layer according to Example 1 is described with reference to the drawing.

Figure 14:
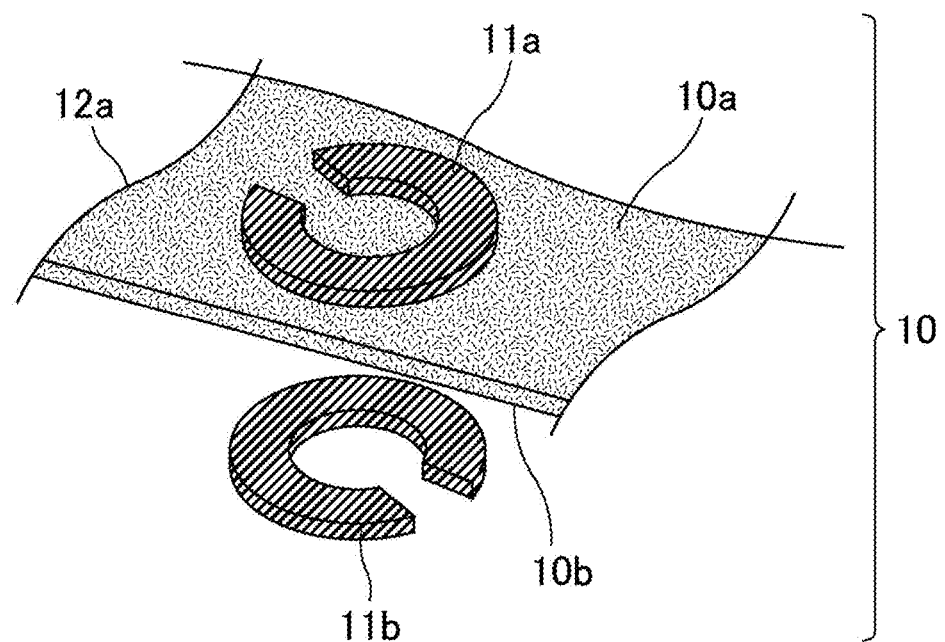
FIG. 14 is a schematic illustration of the positional relationship of elements of a metamaterial layer according to Example 1.

As shown in FIG. 14, in the metamaterial layer 10 according to Example 1, the first C-shaped pattern 11a is arranged adjacent to the first main surface 10a of the non-conductive sheet 12a, and the second C-shaped pattern 11b is arranged adjacent to the second main surface 10b.

The second C-shaped pattern 11b has a shape that is a 180-degree rotated version of the shape of the first C-shaped pattern 11a.

In order to facilitate the understanding of the positional relationship of the elements of the metamaterial layer 10, FIG. 14 focuses on one of the predetermined patterns and shows the elements separated from each other, but the actual metamaterial layer according to Example 1 includes multiple predetermined patterns, and these elements are adhered to each other.

(Evaluation of Shielding Properties)

Next, the shielding properties of the metamaterial layer according to Example 1 were evaluated by the following method.

Figure 15:
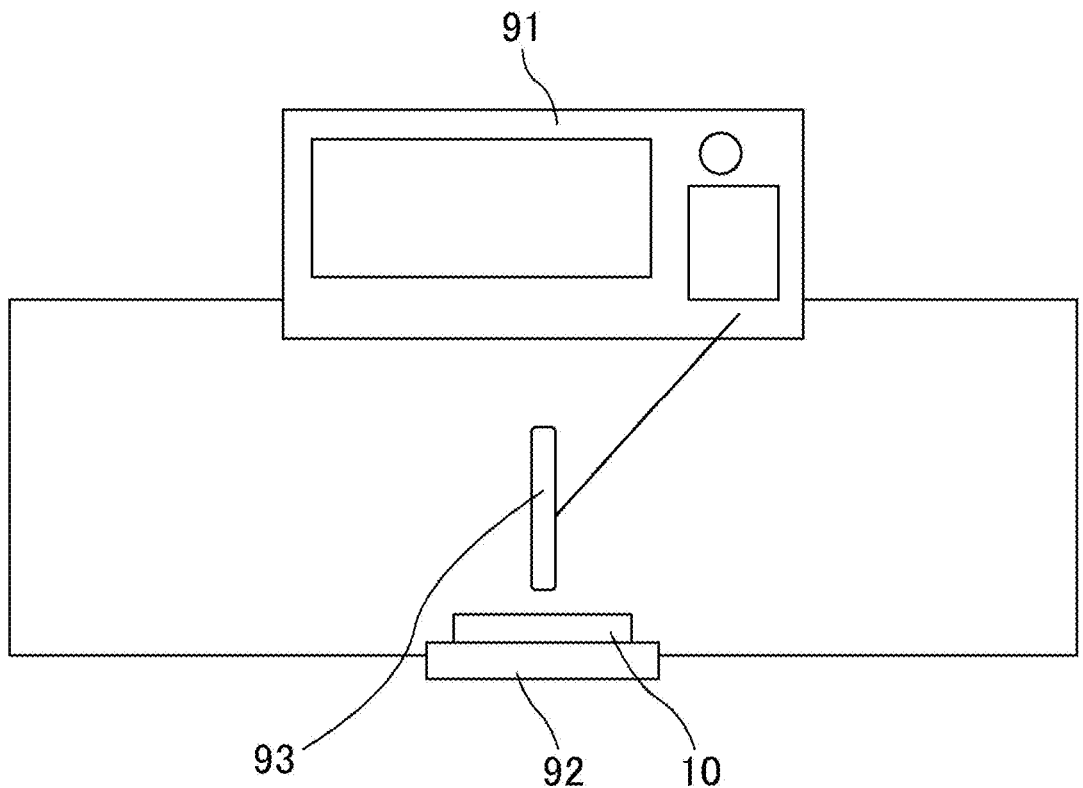
FIG. 15 is a schematic view of a method of evaluating shielding properties of the metamaterial layer.

First, as shown in FIG. 15, a network analyzer 91 (product name: N5232A, manufacturer: Keysight Technologies) to which a microstrip line 92 and a magnetic field probe 93 were connected was provided.

Next, the metamaterial layer 10 according to Example 1 was disposed on the microstrip line 92, with the second main surface facing down.

Subsequently, the transmission loss (S21) and the radiated magnetic field strength (S31) of an electromagnetic wave with a frequency of 0 to 10000 MHz in the case of using the metamaterial layer according to Example 1 were measured.

Figure 16A:
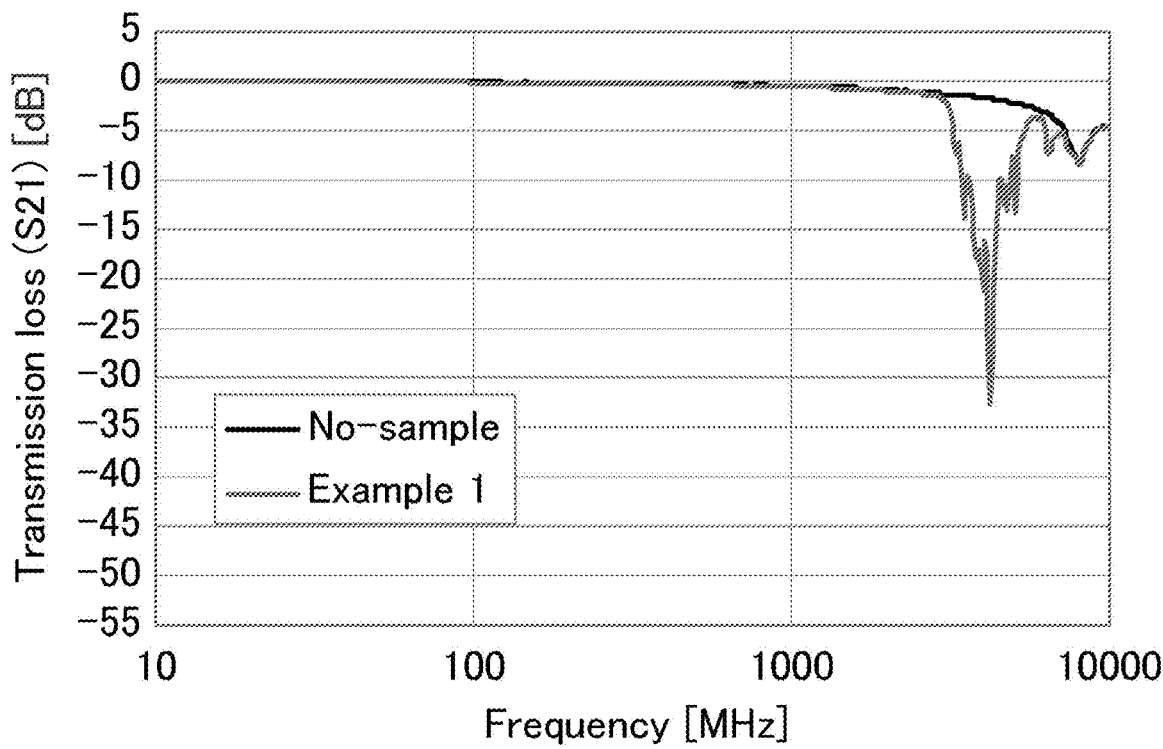
FIG. 16A is a chart of transmission loss of an electromagnetic wave with a frequency of 0 to 10000 MHz in the case of using the metamaterial layer according to Example 1.
Figure 16B:
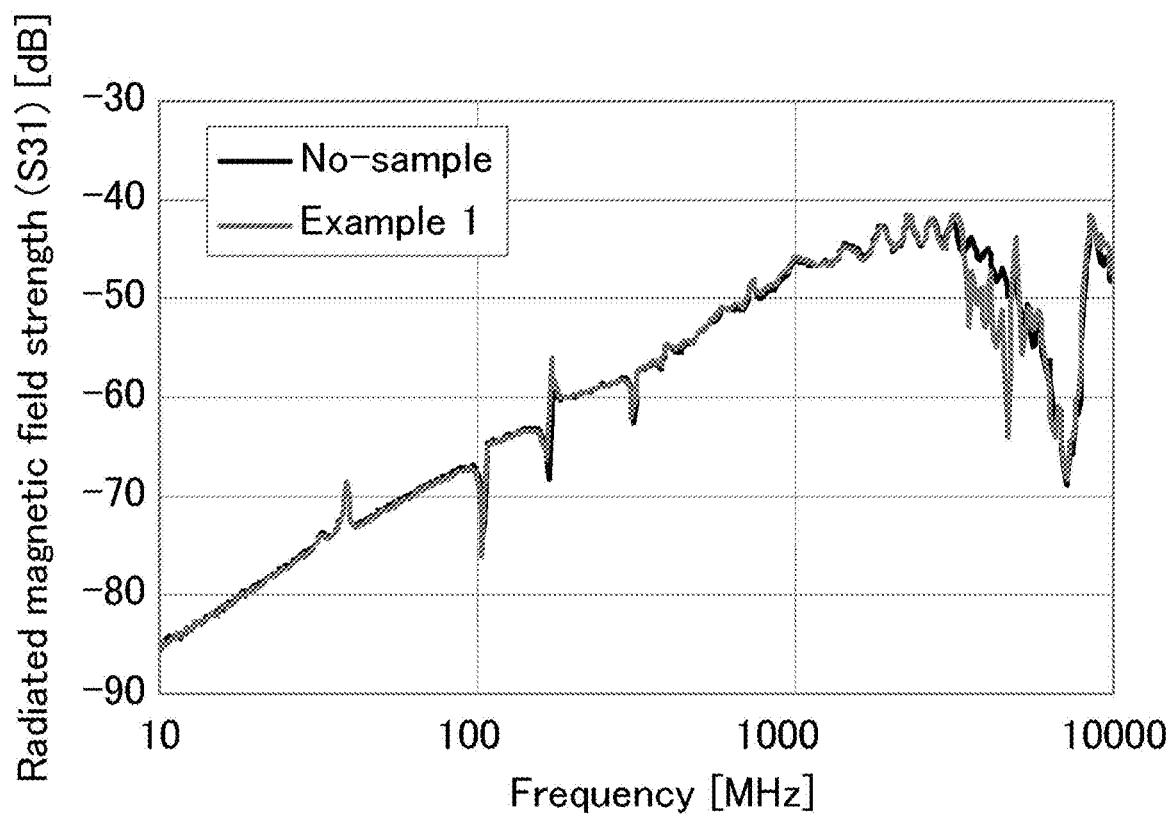
FIG. 16B is a chart of radiated magnetic field strength of an electromagnetic wave with a frequency of 0 to 10000 MHz in the case of using the metamaterial layer according to Example 1.

FIG. 16A and FIG. 16B show the results.

As shown in FIG. 16A and FIG. 16B, it was found that the metamaterial layer according to Example 1 can block an electromagnetic wave with a frequency of 3000 to 6000 MHz.

Next, a 0.01-mm thick adhesive layer made of an epoxy resin was formed on the second main surface of the metamaterial layer according to Example 1, whereby an electromagnetic wave shielding film according to Example 1 was produced.

Example 2

A 25-μm thick non-conductive sheet made of a polyimide composition was further laminated on the second main surface of the non-conductive sheet of the metamaterial layer according to Example 1, whereby a positive metamaterial layer according to Example 2 was produced.

Here, the positional relationship of the elements of the metamaterial layer according to Example 2 is described with reference to the drawing.

Figure 17:
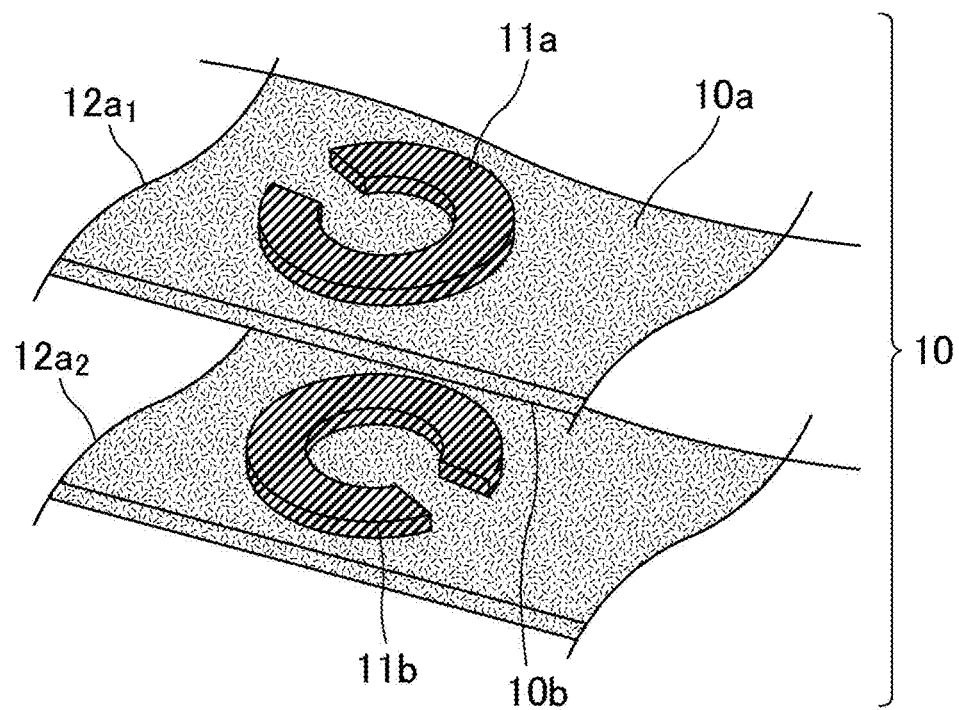
FIG. 17 is a schematic illustration of the positional relationship of elements of a metamaterial layer according to Example 2.

As shown in FIG. 17, in the metamaterial layer 10 according to Example 2, the first C-shaped pattern 11a is arranged adjacent to the first main surface 10a of a non-conductive sheet 12a$_1$, and the second C-shaped pattern 11b is arranged adjacent to the second main surface 10b.

The second C-shaped pattern 11b has a shape that is a 180-degree rotated version of the shape of the first C-shaped pattern 11a.

A non-conductive sheet 12a$_2$ is placed under the second C-shaped pattern 11b.

In order to facilitate the understanding of the positional relationship of the elements of the metamaterial layer 10, FIG. 17 focuses on one of the predetermined patterns and shows the elements separated from each other, but the actual metamaterial layer according to Example 2 includes multiple predetermined patterns, and these elements are adhered to each other.

(Evaluation of Shielding Properties)

The transmission loss (S21) and the radiated magnetic field strength (S31) of an electromagnetic wave with a frequency of 0 to 10000 MHz in the case of using the metamaterial layer according to Example 2 were measured by the same method used for evaluating the shielding properties according to Example 1.

Figure 18A:
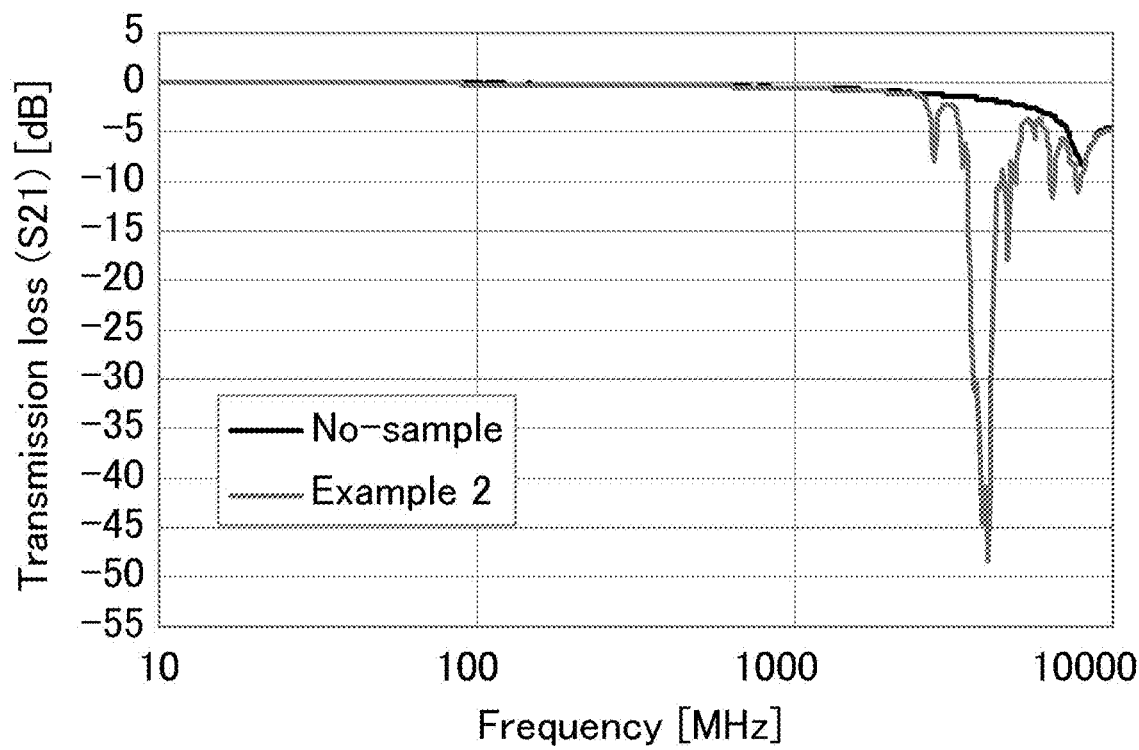
FIG. 18A is a chart of transmission loss of an electromagnetic wave with a frequency of 0 to 10000 MHz in the case of using the metamaterial layer according to Example 2.
Figure 18B:
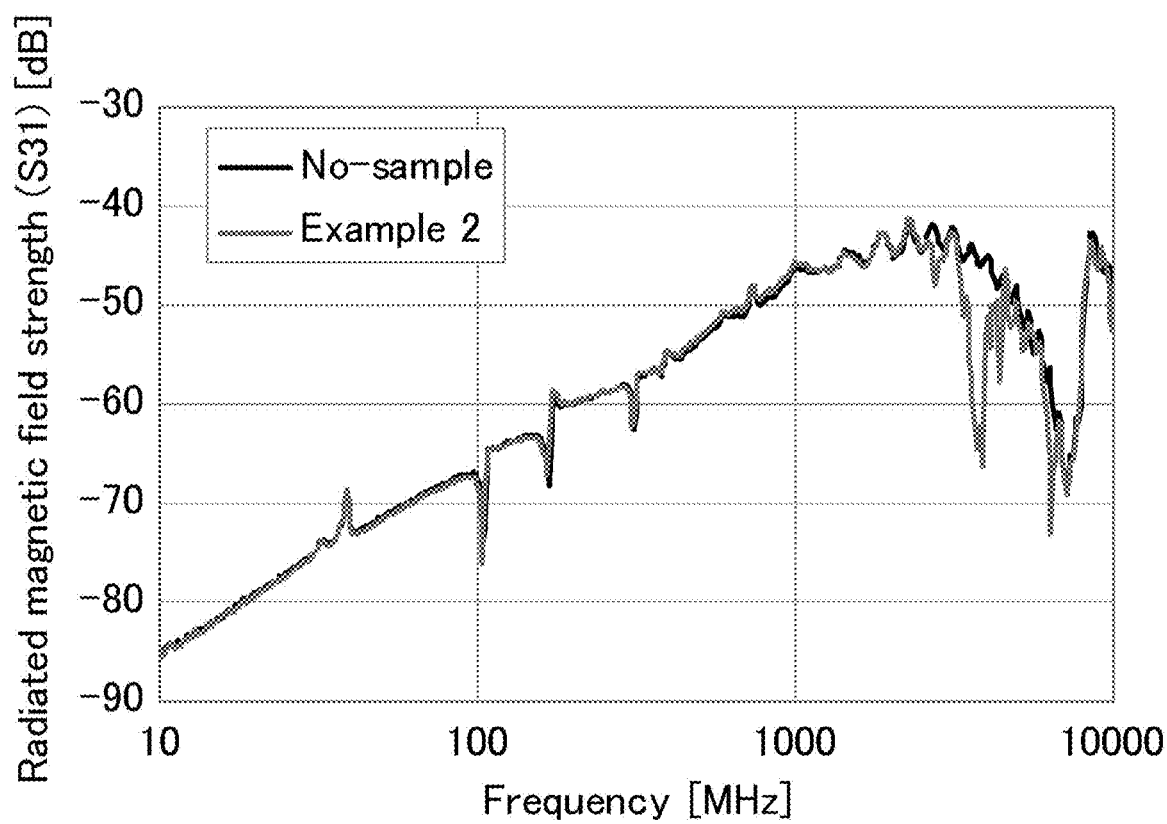
FIG. 18B is a chart of radiated magnetic field strength of an electromagnetic wave with a frequency of 0 to 10000 MHz in the case of using the metamaterial layer according to Example 2.

FIG. 18A and FIG. 18B show the results.

As shown in FIG. 18A and FIG. 18B, it was found that the metamaterial layer according to Example 2 can block an electromagnetic wave with a frequency of 2500 to 5000 MHz.

Next, a 0.01-mm thick adhesive layer made of an epoxy resin was formed on the second main surface of the metamaterial layer according to Example 2, whereby an electromagnetic wave shielding film according to Example 2 was produced.

Example 3

A positive metamaterial layer according to Example 3 was produced as in Example 2, except that the shape of the second C-shaped pattern viewed from the first main surface is the same as the shape of the first C-shaped pattern viewed from the first main surface.

Here, the positional relationship of the elements of the metamaterial layer according to Example 3 is described with reference to the drawing.

Figure 19:
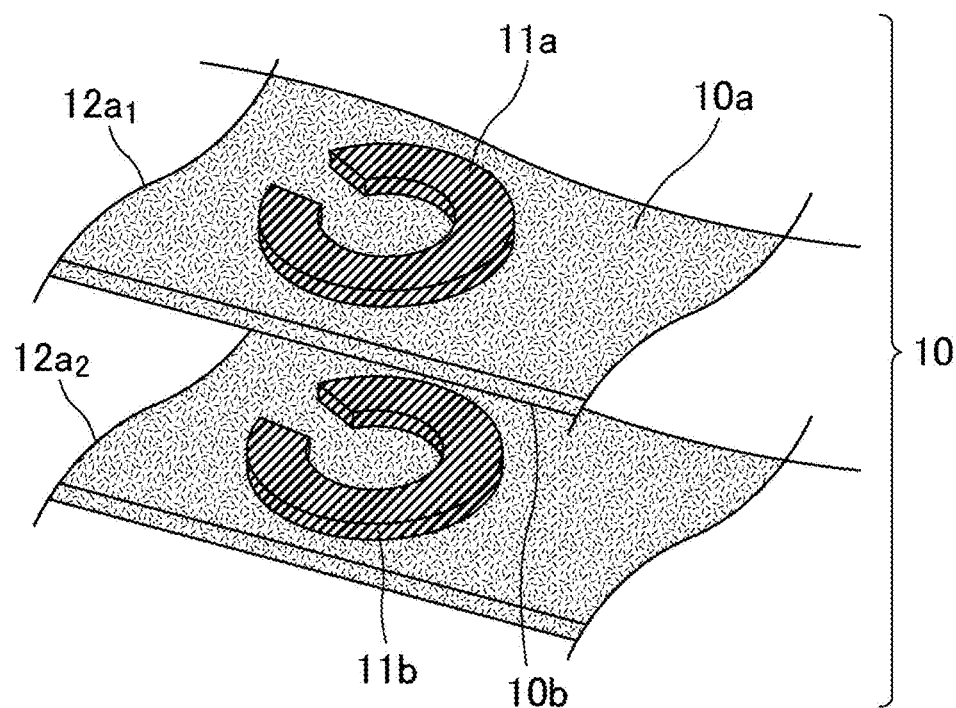
FIG. 19 is a schematic illustration of the positional relationship of elements of a metamaterial layer according to Example 3.

As shown in FIG. 19, in the metamaterial layer 10 according to Example 3, the first C-shaped pattern 11a is arranged adjacent to the first main surface 10a of the non-conductive sheet 12a$_1$, and the second C-shaped pattern 11b is arranged adjacent to the second main surface 10b.

The first C-shaped pattern 11a and the second C-shaped pattern 11b are completely overlapped with each other when viewed from the first main surface 10a.

The non-conductive sheet 12a$_2$ is placed under the second C-shaped pattern 11b.

In order to facilitate the understanding of the positional relationship of the elements of the metamaterial layer 10, FIG. 19 focuses on one of the predetermined patterns and shows the elements separated from each other, but the actual metamaterial layer according to Example 3 includes multiple predetermined patterns, and these elements are adhered to each other.

(Evaluation of Shielding Properties)

The transmission loss (S21) and the radiated magnetic field strength (S31) of an electromagnetic wave with a frequency of 0 to 10000 MHz in the case of using the metamaterial layer according to Example 3 were measured by the same method used for evaluating the shielding properties according to Example 1.

Figure 20A:
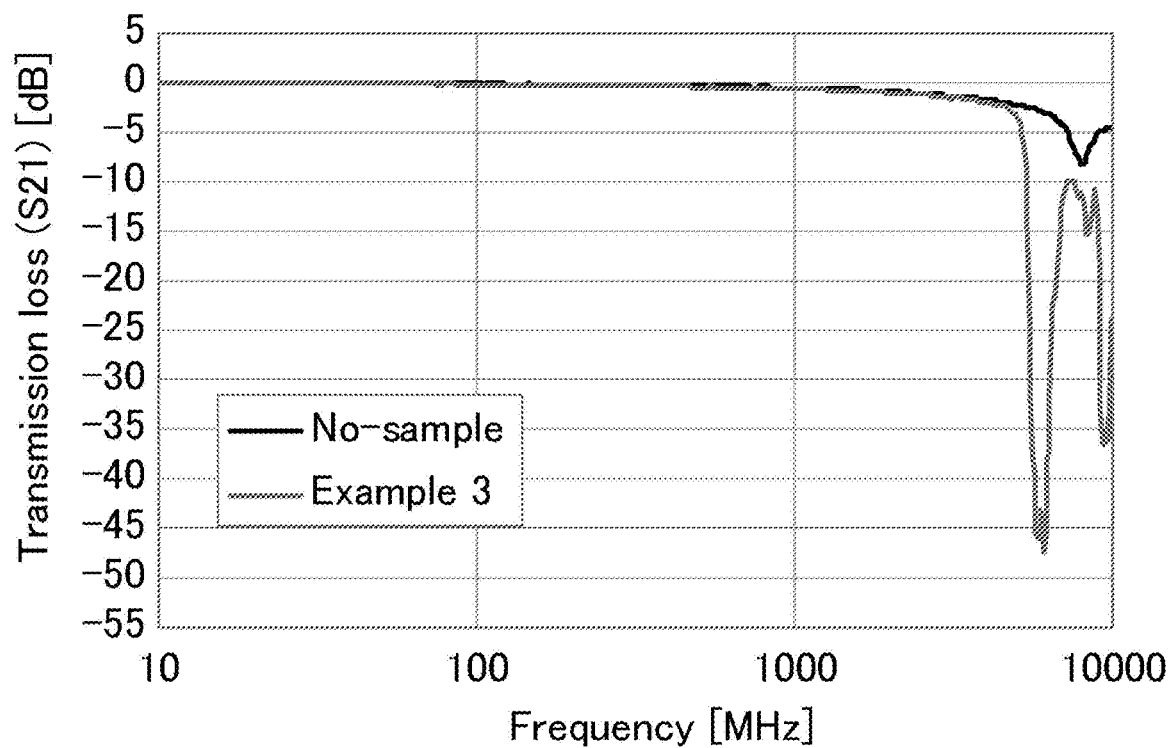
FIG. 20A is a chart of transmission loss of an electromagnetic wave with a frequency of 0 to 10000 MHz in the case of using the metamaterial layer according to Example 3.
Figure 20B:
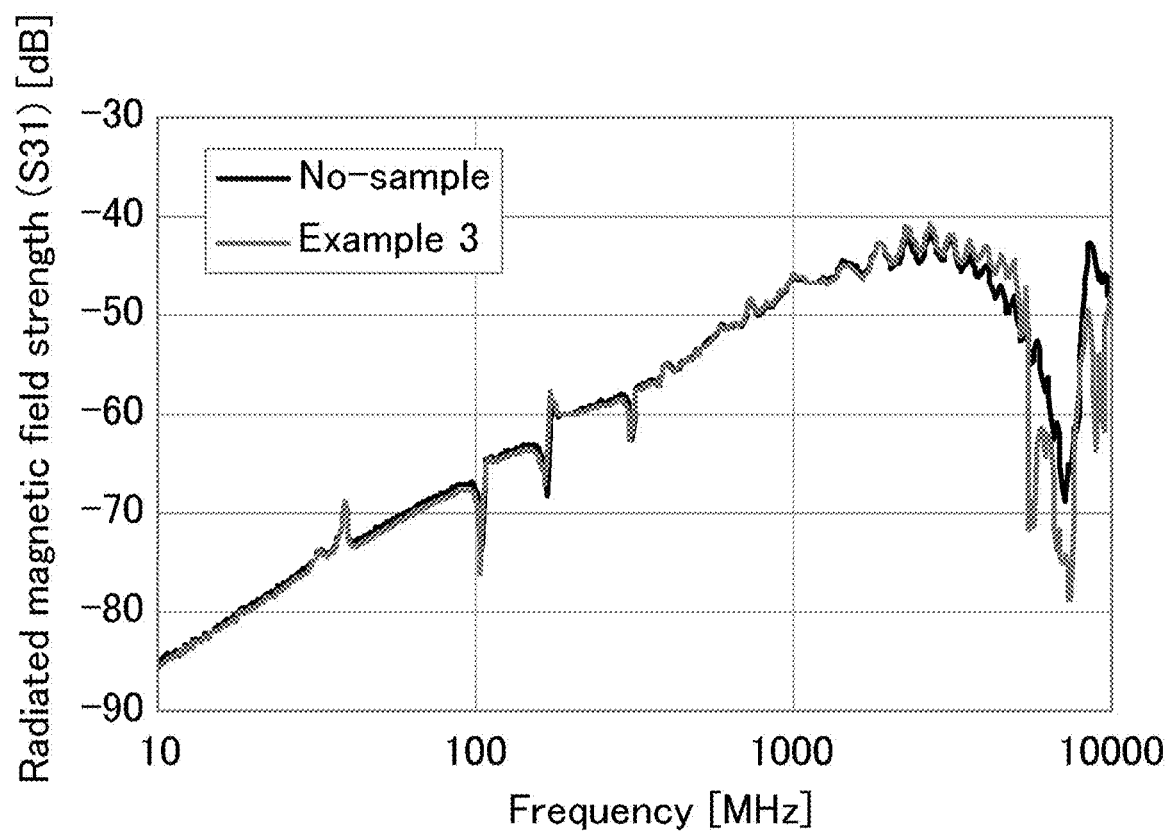
FIG. 20B is a chart of radiated magnetic field strength of an electromagnetic wave with a frequency of 0 to 10000 MHz in the case of using the metamaterial layer according to Example 3.

FIG. 20A and FIG. 20B show the results.

As shown in FIG. 20A and FIG. 20B, it was found that the metamaterial layer according to Example 3 can block an electromagnetic wave with a frequency of 5000 to 7000 MHz.

Next, a 0.01-mm thick adhesive layer made of an epoxy resin was formed on the second main surface of the metamaterial layer according to Example 3, whereby an electromagnetic wave shielding film according to Example 3 was produced.

Example 4

Three 25-μm thick non-conductive sheets each made of a polyimide composition and including a first main surface and a second main surface opposite to the first main surface were prepared. The relative permittivity of the non-conductive sheet was 3.1.

Next, a conductive paste ($8 \times 10^{-5}$ Ωcm) was printed on the first main surface of the first non-conductive sheet to form first C-shaped patterns positioned at the vertices of square cells.

Each first C-shaped pattern had the same shape. Each first C-shaped pattern had a width (line thickness) of 1 mm and a full length (maximum width of the pattern) of 5 mm.

The distance between the centers of gravity of two adjacent first C-shaped patterns was 6 mm.

Next, a conductive paste ($8 \times 10^{-5}$ Ωcm) was printed on the second main surface of the first non-conductive sheet to form second C-shaped patterns positioned at the back of the first C-shaped patterns.

Here, each second C-shaped pattern viewed from the first main surface had a shape that was completely overlapped with the shape of each first C-shaped pattern viewed from the first main surface.

Next, similarly, the first C-shaped patterns and the second C-shaped patterns were formed on a second non-conductive sheet.

Next, these non-conductive sheets were laminated in the order of the first non-conductive sheet, the third non-conductive sheet, and the second non-conductive sheet.

Here, the second non-conductive sheet was rotated by 180 degrees.

Thus, when viewed from the first main surface of the first non-conductive sheet, the first C-shaped pattern and the second C-shaped pattern formed on the second non-conductive sheet each had a shape that is a 180-degree rotated version of the shape of each of the first C-shaped pattern and the second C-shaped pattern formed on the first non-conductive sheet.

A positive metamaterial layer according to Example 4 was formed through the above steps.

Here, the positional relationship of the elements of the metamaterial layer according to Example 4 is described with reference to the drawing.

Figure 21:
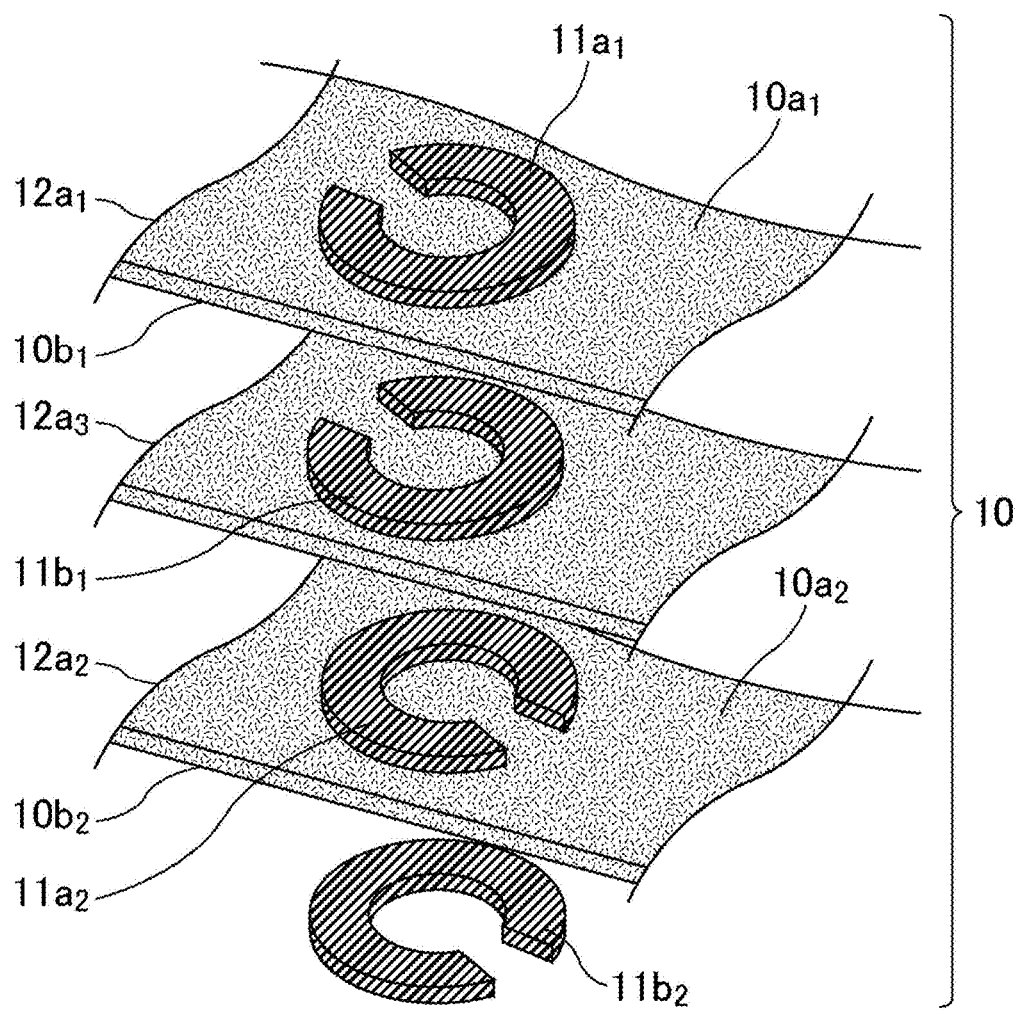
FIG. 21 is a schematic illustration of the positional relationship of elements of a metamaterial layer according to Example 4.

As shown in FIG. 21, in the metamaterial layer 10 according to Example 4, a first C-shaped pattern $11a_1$ is arranged adjacent to a first main surface $10a_1$ of the first non-conductive sheet $12a_1$, and a second C-shaped pattern $11b_1$ is arranged adjacent to a second main surface $10b_1$ of the first non-conductive sheet $12a_1$.

The first C-shaped pattern $11a_1$ and the second C-shaped pattern $11b_1$ are completely overlapped with each other when viewed from the first main surface $10a_1$.

In the metamaterial layer 10 according to Example 4, a first C-shaped pattern $11a_2$ is arranged adjacent to a first main surface $10a_2$ of the second non-conductive sheet $12a_2$, and a second C-shaped pattern $11b_2$ is arranged adjacent to the second main surface $10b_2$ of the second non-conductive sheet $12a_2$.

The first C-shaped pattern $11a_2$ and the second C-shaped pattern $11b_2$ are completely overlapped with other when viewed from the first main surface $10a_2$.

In the metamaterial layer 10 according to Example 4, the first non-conductive sheet $12a_1$, a third non-conductive sheet $12a_3$, and the second non-conductive sheet $12a_2$ are laminated sequentially from the top.

In the metamaterial layer 10 according to Example 4, the first C-shaped patterns $11a_2$ and the second C-shaped patterns $11b_2$ each have a shape that is a 180-degree rotated version the shape of each of the first C-shaped pattern $11a_1$ and the second C-shaped patterns $11b_1$.

In order to facilitate the understanding of the positional relationship of the elements of the metamaterial layer 10, FIG. 21 focuses on one of the predetermined patterns and shows the elements separated from each other, but the actual metamaterial layer according to Example 4 includes multiple predetermined patterns, and these elements are adhered to each other.

(Evaluation of Shielding Properties)

The transmission loss (S21) and the radiated magnetic field strength (S31) of an electromagnetic wave with a frequency of 0 to 10000 MHz in the case of using the metamaterial layer according to Example 4 were measured by the same method used for evaluating the shielding properties according to Example 1.

Figure 22A:
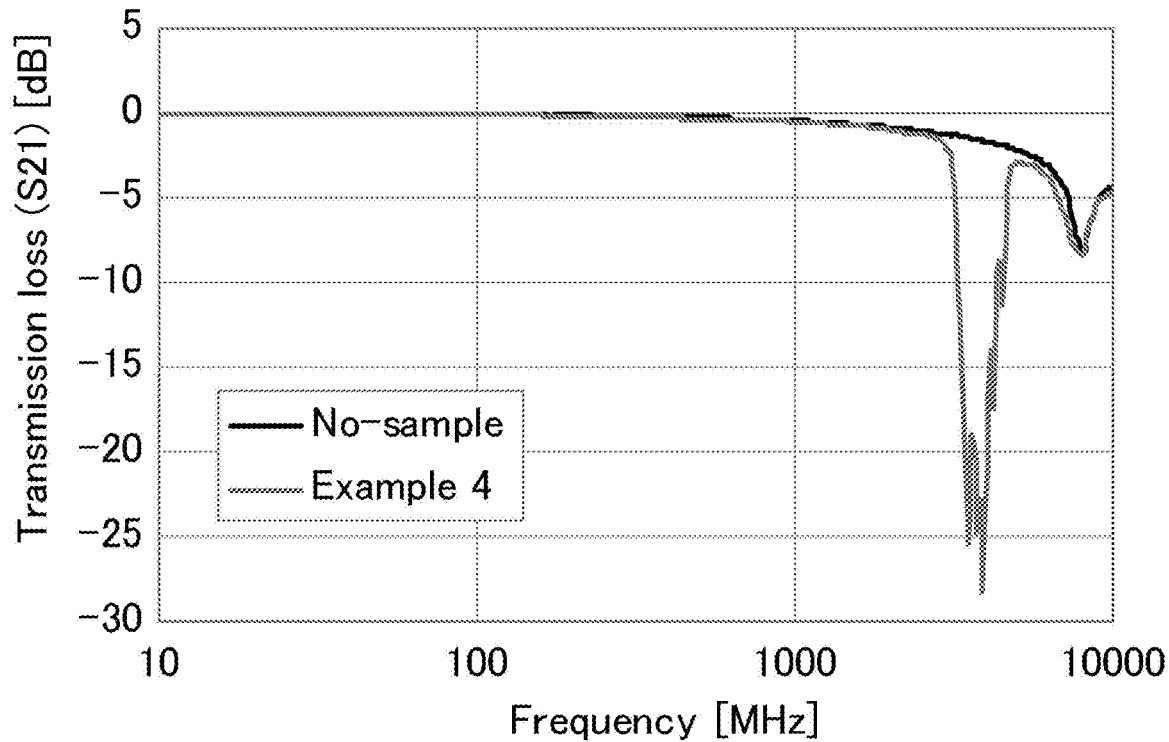
FIG. 22A is a chart of transmission loss of an electromagnetic wave with a frequency of 0 to 10000 MHz in the case of using the metamaterial layer according to Example 4.
Figure 22B:
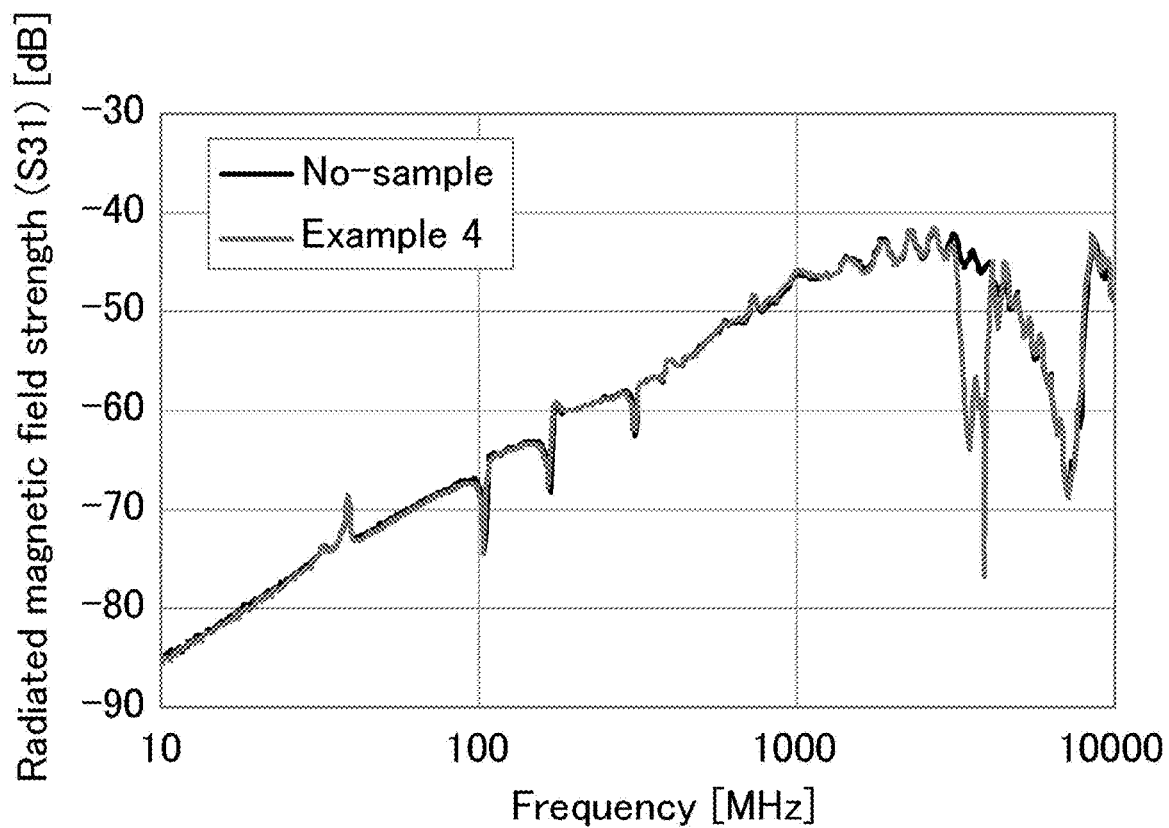
FIG. 22B is a chart of radiated magnetic field strength of an electromagnetic wave with a frequency of 0 to 10000 MHz in the case of using the metamaterial layer according to Example 4.

FIG. 22A and FIG. 22B show the results.

As shown in FIG. 22A and FIG. 22B, it was found that the metamaterial layer according to Example 4 can block an electromagnetic wave with a frequency of 3000 to 5000 MHz.

Next, a 0.01-mm thick adhesive layer made of an epoxy resin was formed on the second main surface of the metamaterial layer according to Example 4, whereby an electromagnetic wave shielding film according to Example 4 was produced.

Example 5

A 25-μm thick conductive sheet made of a conductive paste and including a first main surface and a second main surface opposite to the first main surface was prepared.

Next, the conductive sheet was masked and etched to form through holes in a C-shaped pattern (hereinafter also referred to as the "third C-shaped pattern") at the vertices of square cells.

Each third C-shaped pattern had the same shape. Each first C-shaped pattern had a width (line thickness) of 1 mm and a full length (maximum width of the pattern) of 5 mm.

The distance between the centers of gravity of two adjacent third C-shaped patterns was 6 mm.

Next, a 25-μm thick non-conductive sheet made of a polyimide composition was laminated on the second main surface of the conductive sheet, whereby a negative metamaterial layer according to Example 5 was produced.

Here, the positional relationship of the elements of the metamaterial layer according to Example 5 is described with reference to the drawing.

Figure 23:
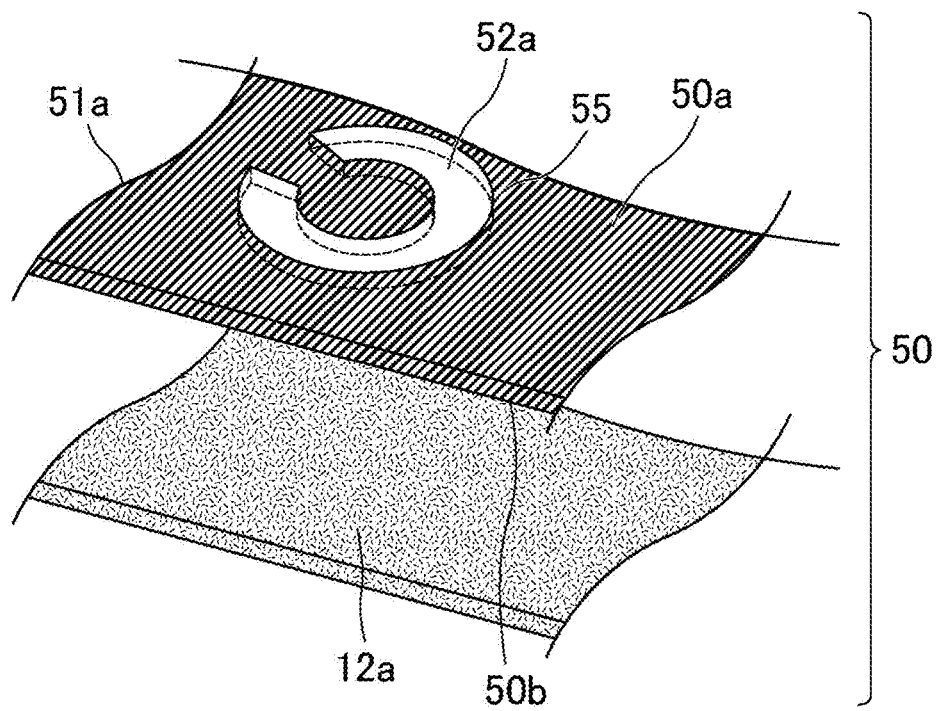
FIG. 23 is a schematic illustration of the positional relationship of elements of a metamaterial layer according to Example 5.

As shown in FIG. 23, in the metamaterial layer 50 according to Example 5, the through holes 55 formed in the conductive sheet $51a$ define the third C-shaped pattern $52a$.

The non-conductive sheet $12a$ is laminated on the second main surface $50b$ of the conductive sheet $51a$.

In order to facilitate the understanding of the positional relationship of the elements of the metamaterial layer 50, FIG. 23 focuses on one of the predetermined patterns and shows the elements separated from each other, but the actual metamaterial layer according to Example 5 includes multiple predetermined patterns, and these elements are adhered to each other.

(Evaluation of Shielding Properties)

The transmission loss (S21) and the radiated magnetic field strength (S31) of an electromagnetic wave with a frequency of 0 to 10000 MHz in the case of using the metamaterial layer according to Example 5 were measured by the same method used for evaluating the shielding properties according to Example 1.

Figure 24A:
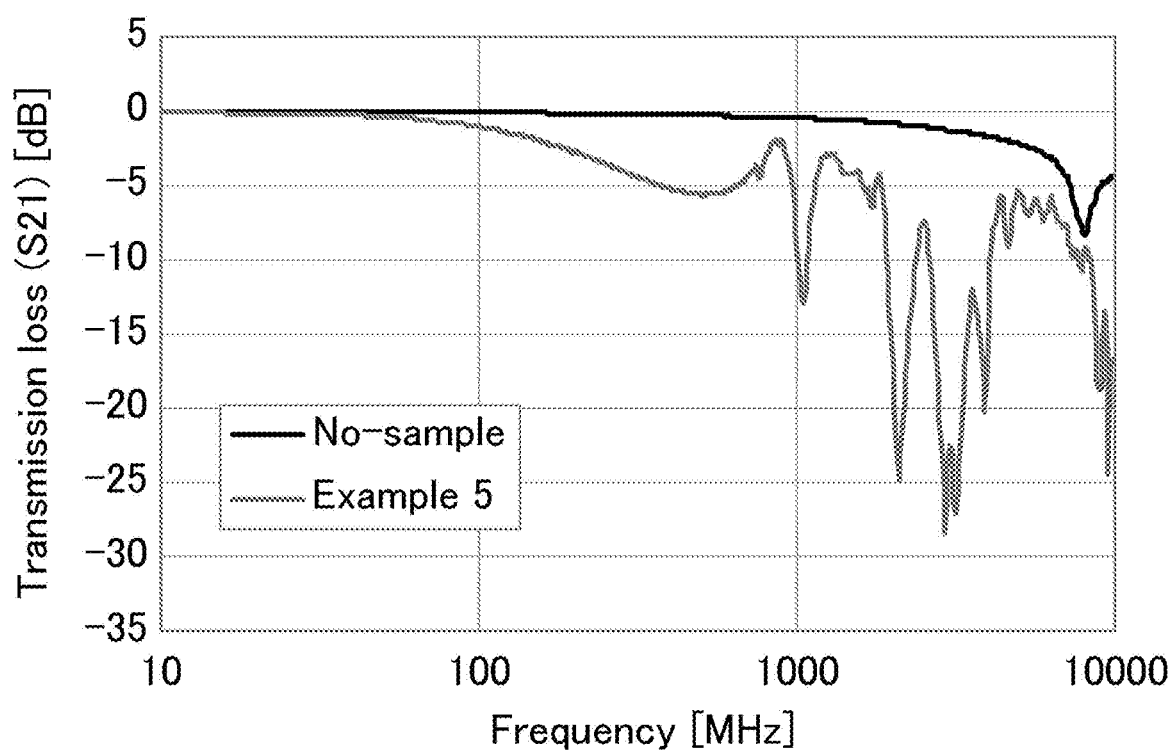
FIG. 24A is a chart of transmission loss of an electromagnetic wave with a frequency of 0 to 10000 MHz in the case of using the metamaterial layer according to Example 5.
Figure 24B:
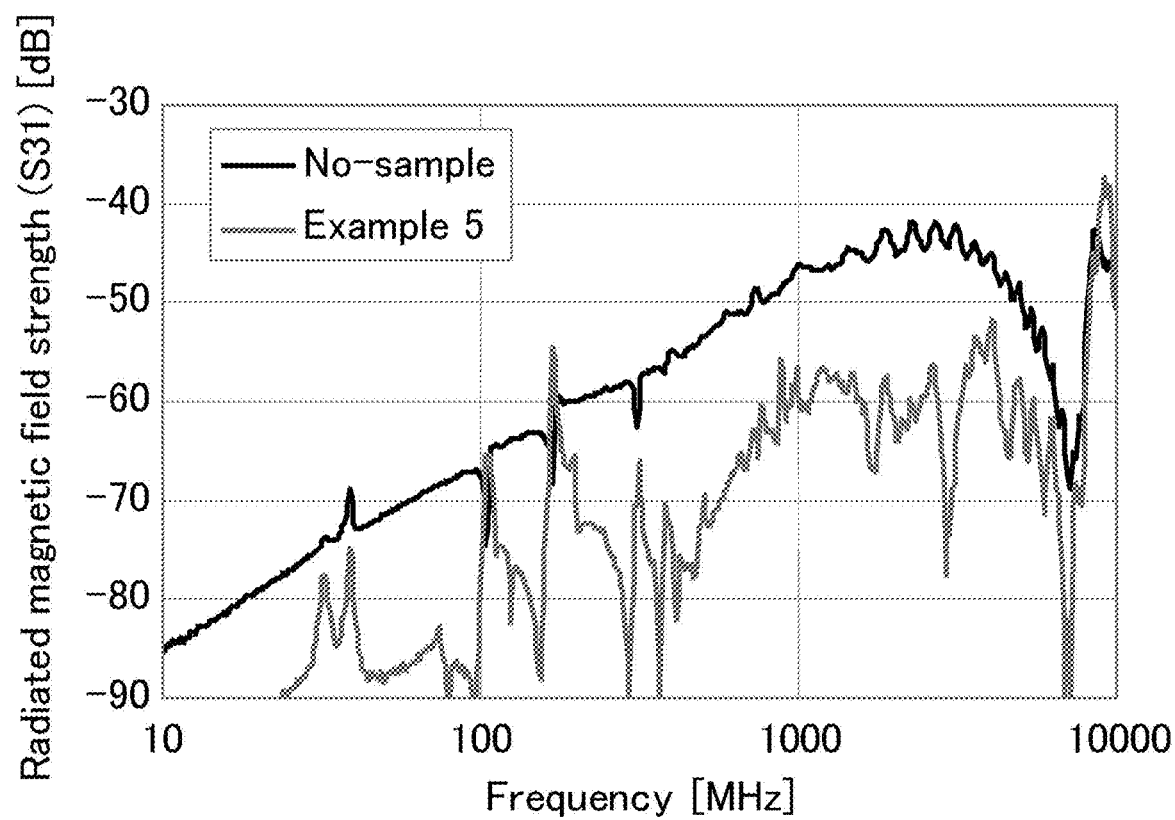
FIG. 24B is a chart of radiated magnetic field strength of an electromagnetic wave with a frequency of 0 to 10000 MHz in the case of using the metamaterial layer according to Example 5.

FIG. 24A and FIG. 24B show the results.

As shown in FIG. 24A and FIG. 24B, it was found that the metamaterial layer according to Example 5 allows passage of an electromagnetic wave with a frequency of 400 to 8000 MHz.

REFERENCE SIGNS LIST

1, 101, 201, 301A, 301B, 401, 501, 601, 701, 801A, 801B electromagnetic wave shielding film metamaterial layer
10a, 10$a_1$, 10$a_2$, 50a first main surface
10b, 10$b_1$, 10$b_2$, 50b second main surface
11 conductive region
11a, 11$a_1$, 11$a_2$, 11b, 11$b_1$, 11$b_2$ predetermined pattern (C-shaped pattern)
11$a_{11}$, 11$a_{12}$, 11$a_{21}$, 11$a_{22}$, 11$a_{23}$ pattern
12 non-conductive region
12a, 12$a_1$, 12$a_2$, 12$a_3$ non-conductive sheet
12$a_i$ portion inside C-shaped predetermined pattern
12$a_o$ portion other than inside C-shaped predetermined pattern
20, 60 adhesive layer
30, 70 protective layer
40, 80 conductive layer
50 metamaterial layer
51 conductive region
51a conductive sheet
52 non-conductive region
52a, 52b predetermined pattern (C-shaped pattern)
55 through hole
91 network analyzer
92 microstrip line
93 magnetic field probe

The invention claimed is:

1. An electromagnetic wave shielding film, comprising:
    a metamaterial layer including a first main surface and a second main surface opposite to the first main surface; and
    an adhesive layer formed on the second main surface of the metamaterial layer,
    wherein when the metamaterial layer is viewed in a plan view from at least one of the first main surface or the second main surface, the metamaterial layer includes a conductive region where predetermined patterns made of a conductive material are periodically arranged, and a non-conductive region other than the conductive region,
    the non-conductive region includes a non-conductive sheet made of a resin composition, and
    the predetermined patterns are embedded in the non-conductive sheet.

2. The electromagnetic wave shielding film according to claim 1,
    wherein the predetermined patterns include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

3. The electromagnetic wave shielding film according to claim 1,
    wherein the resin composition has a relative permittivity of 1 to 20000.

4. The electromagnetic wave shielding film according to claim 1,
    wherein the resin composition contains a filler.

5. The electromagnetic wave shielding film according to claim 4,
    wherein the filler is at least one of an organic filler or an inorganic filler.

6. The electromagnetic wave shielding film according to claim 1,
    wherein the adhesive layer is a conductive adhesive layer.

7. The electromagnetic wave shielding film according to claim 1,
    wherein at least one of a conductive layer or a magnetic layer is formed between the adhesive layer and the metamaterial layer.

8. The electromagnetic wave shielding film according to claim 1,
    wherein at least one of a conductive layer or a magnetic layer is formed on the first main surface of the metamaterial layer.

9. The electromagnetic wave shielding film according to claim 1,
    wherein a protective layer is formed on the first main surface of the metamaterial layer.

10. An electromagnetic wave shielding film, comprising:
    a metamaterial layer including a first main surface and a second main surface opposite to the first main surface; and
    an adhesive layer formed on the second main surface of the metamaterial layer,
    wherein when the metamaterial layer is viewed in a plan view from at least one of the first main surface or the second main surface, the metamaterial layer includes a non-conductive region where predetermined patterns made of a non-conductive material are periodically arranged, and a conductive region other than the non-conductive region.

11. The electromagnetic wave shielding film according to claim 10,
    wherein the predetermined patterns include at least one pattern selected from the group consisting of a linear shape, a curved shape, a polygonal shape, a circular shape, an elliptical shape, a ring shape, a C-shape, a U-shape, an L-shape, a crank shape, and a Jerusalem cross shape.

12. The electromagnetic wave shielding film according to claim 10,
    wherein the conductive region includes a conductive sheet made of a conductive material, and
    the predetermined patterns are embedded in the conductive sheet.

13. The electromagnetic wave shielding film according to claim 10,
    wherein the non-conductive material has a relative permittivity of 1 to 20000.

14. The electromagnetic wave shielding film according to claim 10, wherein the non-conductive material includes a filler.

15. The electromagnetic wave shielding film according to claim 14,
wherein the filler is at least one of an organic filler or an inorganic filler.

16. The electromagnetic wave shielding film according to claim 10,
wherein the predetermined patterns are outlined with through holes penetrating from the first main surface to the second main surface of the metamaterial layer.

17. The electromagnetic wave shielding film according to claim 10,
wherein the adhesive layer is a conductive adhesive layer.

18. The electromagnetic wave shielding film according to claim 10,
wherein at least one of a conductive layer or a magnetic layer is formed between the adhesive layer and the metamaterial layer.

19. The electromagnetic wave shielding film according to claim 10,
wherein at least one of a conductive layer or a magnetic layer is formed on the first main surface of the metamaterial layer.

20. The electromagnetic wave shielding film according to claim 10,
wherein a protective layer is formed on the first main surface of the metamaterial layer.

* * * * *